(12) United States Patent
Oka et al.

(10) Patent No.: US 8,390,135 B2
(45) Date of Patent: Mar. 5, 2013

(54) SEMICONDUCTOR DEVICE

(75) Inventors: Yoshihiro Oka, Kanagawa (JP); Kinya Goto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/110,023

(22) Filed: May 18, 2011

(65) Prior Publication Data

US 2011/0298133 A1 Dec. 8, 2011

(30) Foreign Application Priority Data

Jun. 4, 2010 (JP) .................................. 2010-128678

(51) Int. Cl.
*H01L 23/48* (2006.01)
*H01L 23/52* (2006.01)
*H01L 29/40* (2006.01)

(52) U.S. Cl. . 257/784; 257/760; 257/288; 257/E21.006; 257/E21.048; 257/E21.054; 257/E21.308; 257/E21.304; 257/E21.311; 257/E21.151; 257/E21.19; 257/E21.267; 257/E21.277; 257/E21.278; 257/E21.293

(58) Field of Classification Search .................. 257/784, 257/759, 760, 774, 782, 279, 288, 499, 503, 257/613, E21.006, E21.048, E21.054, E21.19, 257/E21.151, E21.267, E21, 277, E21.278, 257/E21.293, E21.304, E21.311, E21.308

See application file for complete search history.

(56) References Cited

U.S. PATENT DOCUMENTS

| 8,178,631 B2 * | 5/2012 | Enoki et al. .................... 525/540 |
| 2005/0121786 A1 * | 6/2005 | Furuya et al. .................. 257/751 |
| 2011/0204525 A1 * | 8/2011 | Seo ............................... 257/774 |

FOREIGN PATENT DOCUMENTS

| JP | 2007-318067 A | 12/2007 |
| JP | 2008-263105 A | 10/2008 |

* cited by examiner

*Primary Examiner* — David Nhu
(74) *Attorney, Agent, or Firm* — Mattingly & Malur, P.C.

(57) ABSTRACT

The reliability of a porous Low-k film is improved. The mean diameter of first pores and second pores in an interlayer insulation film of a second fine layer including a porous Low-k film is set at 1.0 nm or more and less than 1.45 nm. This prevents the formation of a modified layer over the surface of the interlayer insulation film by process damages. Further, the formation of the moisture-containing modified layer is inhibited to prevent oxidation of a barrier film and a main conductor film forming respective wirings. This prevents deterioration of breakdown voltage between respective wirings. This prevents deterioration of the EM lifetime of wirings formed adjacent to the interlayer insulation film and the inter-wiring TDDB lifetime of the wirings.

17 Claims, 29 Drawing Sheets

10 : PORE
11 : PORE
CL : MODIFIED LAYER
IL2 : INTERLAYER INSULATION FILM

SEMICONDUCTOR DEVICE

CROSS-REFERENCE TO RELATED APPLICATIONS

The disclosure of Japanese Patent Application No. 2010-128678 filed on Jun. 4, 2010 including the specification, drawings and abstract is incorporated herein by reference in its entirety.

BACKGROUND

The present invention relates to a semiconductor device. More particularly, it relates to a technology effectively applicable to a semiconductor device having a low relative dielectric constant film.

Patent Literature 1 (Japanese Unexamined Patent Publication No. 2008-263105) discloses the following. A porous Low-k film is formed in a lamination structure including a plurality of insulation layers; the plural insulation layers are formed in the following manner: each insulation layer is deposited by a CVD (Chemical Vapor Deposition) method, or the like, and then, is subjected to a porogen elimination treatment. As a result, pores are provided in the inside thereof. The film thickness of each insulation layer forming the porous Low-k film is reduced. This prevents the plural pores formed in the porous Low-k film from being in contact with one another, and being continuously coupled. Namely, herein, it is supposed as follows. By reducing the film thickness of each insulation layer, it is possible to prevent the reduction of the mechanical strength of the porous Low-k film and the deterioration of the film quality of the porous Low-k film due to connection of pores.

Patent Literature 2 (Japanese Unexamined Patent Publication No. 2007-318067) discloses that, using porogen, a Low-k film is formed by a CVD method.

PATENT LITERATURES

[Patent Literature 1]
Japanese Unexamined Patent Publication No. 2008-263105
[Patent Literature 2]
Japanese Unexamined Patent Publication No. 2007-318067

In the leading system LSI (Large Scale Integration), with an advance of miniaturization of elements, the wiring delay (RC (Resistance-Capacitance) delay) in proportion to the product of the wiring resistance and the parasitic capacitance of wiring unfavorably increases. As a measure against this problem, there has been frequently adopted a method by which copper (Cu) is used for wiring to reduce the wiring resistance, and an insulation film (Low-k film) having a low relative dielectric constant, the relative dielectric constant k being 2.5 or more and 3.1 or less, is used for the interlayer insulation film to reduce the parasitic capacitance. In recent years, as a material with a further lower relative dielectric constant, there has been developed a porous Low-k film obtained by introducing pores into the Low-k film.

Incidentally, the Patent Literature 1 describes as follows: by adjusting the amount of porogen for forming pores in the porous Low-k film, it is possible to prevent the reduction of the mechanical strength of the porous Low-k film, and it is possible to reduce the relative dielectric constant of the porous Low-k film. However, there is no description on the numerical values on the specific size of the pore formed by adjusting the flow rate of porogen.

However, the porous Low-k film is low in resistance to the process damages due to etching, ashing, CMP (Chemical Mechanical Polishing), deposition, cleaning, or the like. Therefore, the damaged region is altered, resulting in reduction of the reliability of the porous Low-k film. When the damaged porous Low-k film is altered, the electric characteristics of the porous Low-k film are deteriorated. Namely, when a treatment such as etching or ashing is performed, the film quality of the porous Low-k film exposed to a plasma, a chemical, or the like is degraded.

At this step, the damaged porous Low-k film is enhanced in hydrophilicity, so that moisture adsorbs thereto, resulting in an increase in relative dielectric constant. Accordingly, the moisture contained in the porous Low-k film oxidizes the surface of the damascene wirings adjacent to the porous Low-k film. Thus, the copper in the damascene wirings may diffuse into the porous Low-k film. This results in shortening of the inter-wiring TDDB (Time Dependent Dielectric Breakdown) lifetime between wirings disposed side by side in the porous Low-k film. Further, the moisture contained in the porous Low-k film oxidizes the surface of the damascene wirings adjacent to the porous Low-k film. This may reduce the adhesion between the damascene wiring and the porous Low-k film or other insulation films adjacent to the damascene wiring. In this case, the wiring EM (Electro Migration) lifetime of the damascene wiring formed in the porous Low-k film is reduced, resulting in a reduction of the reliability of the porous Low-k film. Further, the porous Low-k film becomes more likely to contain a moisture, and copper diffuses into the porous Low-k film. These causes a reduction of the breakdown voltage between wirings disposed via the porous Low-k film, which leads to the reduction of the electric characteristics of the porous Low-k film.

It is an object of the present invention to improve the reliability of a semiconductor device. Particularly, the damage resistance of the interlayer insulation film is improved.

Further, it is another object of the present invention to improve the performances of a semiconductor device. Particularly, the electric characteristics of the interlayer insulation film are improved.

The foregoing and other objects and novel features of the present invention will be apparent from the description of the present specification and the accompanying drawings.

SUMMARY

Summaries of the representative ones of the inventions disclosed in the present application will be described in brief as follows.

A semiconductor device which is one preferred embodiment of the present invention includes: a semiconductor substrate; an interlayer insulation film formed over the semiconductor substrate, and having a plurality of pores in the inside thereof; and a wiring formed in contact with the interlayer insulation film. The pores include a plurality of first pores formed, by the formation of an insulation film, in the insulation film, and a plurality of second pores formed at positions from each of which porogen disposed in the insulation film has been eliminated due to the formation of the interlayer insulation film by subjecting the insulation film to a curing step. The mean diameter of the pores is 1.0 nm or more and less than 1.45 nm.

Effects obtainable by the representative ones of the inventions disclosed in the present application will be described in brief as follows.

In accordance with one preferred embodiment of the present invention, it is possible to improve the reliability of a semiconductor device.

DETAILED DESCRIPTION

Below, embodiments of the present invention will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle, unless particularly required.

Figure 1:
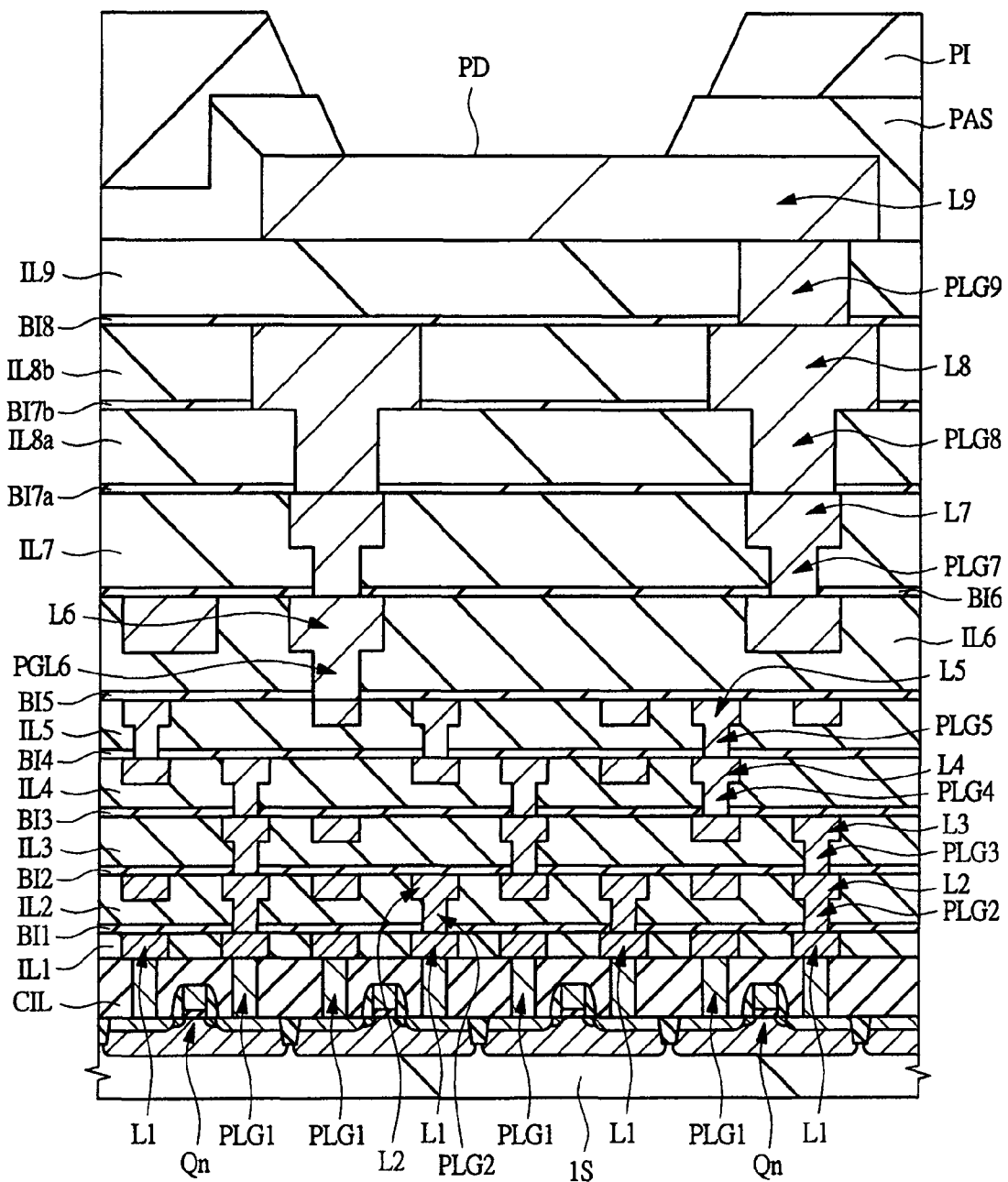
FIG. 1 is a cross-sectional view of a semiconductor device which is one embodiment of the present invention.

One example of a semiconductor device in accordance with an embodiment of the present invention will be described by reference to FIG. 1. FIG. 1 is a cross-sectional view showing a part of a semiconductor device having, on a semiconductor substrate, MISFETs (Metal Insulator Semiconductor Field Effect Transistors) which are field-effect transistors, and a plurality of wiring layers formed over the MISFETs.

In FIG. 1, over a semiconductor substrate 1S including a silicon single crystal, a plurality of MISFETs Qn are formed. The plural MISFETs Qn are formed in an active region isolated by an element isolation region, and has, for example, the following configuration. Specifically, in the active region isolated by the element isolation region, a well is formed. Over the well, the MISFET Qn is formed. The MISFET Qn has, over the main surface of the semiconductor substrate 1S, a gate insulation film including, for example, a silicon oxide film, and has, over the gate insulation film, a gate electrode including a lamination film of a polysilicon film, and a silicide film (such as a nickel silicide film) provided over the polysilicon film. Over the sidewalls on opposite sides of the gate electrode, sidewalls including, for example, a silicon oxide film are formed. In portions of the semiconductor substrate under the sidewalls, shallow impurity diffusion regions are formed in alignment with the gate electrode. Then, outside the shallow impurity diffusion regions, deep impurity diffusion regions are formed in alignment with the sidewalls, respectively. A pair of the shallow impurity diffusion regions and a pair of the deep impurity diffusion regions form the source region and the drain region of the MISFET Qn, respectively. In the foregoing manner, over the semiconductor substrate 1S, the MISFET Qn is formed.

Subsequently, as shown in FIG. 1, over the semiconductor substrate 1S including a plurality of MISFETs Qn formed thereover, a contact interlayer insulation film CIL is formed. The contact interlayer insulation film CIL is formed of a lamination film of an ozone TEOS film formed by a thermal CVD method using, for example, ozone and TEOS (Tetra Ethyl Ortho Silicate) as raw materials, and a plasma TEOS film formed by a plasma CVD method using TEOS as a raw material, provided over the ozone TEOS film. Then, there are formed a plurality of plugs PLG1 penetrating through the contact interlayer insulation film CIL, and reaching the source regions and the drain regions of the MISFETs Qn. The plug PLG1 is formed in the following manner: a barrier conductor film including, for example, a titanium/titanium nitride film (below, the titanium/titanium nitride film denotes a film formed of titanium and titanium nitride disposed over the titanium); and a tungsten film formed over the barrier conductor film are embedded in the contact hole. The titanium/titanium nitride film is a film disposed for preventing tungsten forming the tungsten film from diffusing into silicon. In addition, the titanium/titanium nitride film is for preventing the following: in the CVD method in which $WF_6$ (tungsten fluoride) is subjected to a reduction treatment for forming the tungsten film, fluorine attack is made on and damages the contact interlayer insulation film CIL and the semiconductor substrate 1S. Incidentally, the contact interlayer insulation film CIL may be formed of any film of a silicon oxide film ($SiO_2$ film) a SiOF film, or a silicon nitride film.

Then, over the contact interlayer insulation film CIL, a plurality of first-layer wirings L1 are formed. Specifically, the first-layer wirings L1 are formed in such a manner as to be embedded in the interlayer insulation film IL1 formed over the contact interlayer insulation film CIL including the plugs PLG1 formed therein. The first-layer wirings L1 are formed in contact with the interlayer insulation film IL1. The interlayer insulation film IL1 includes, for example, a Low-k film having a lower relative dielectric constant than that of a passivation film PAS formed in a layer overlying the semiconductor substrate 1S, and includes, for example, a SiOC film. In other words, by embedding a film mainly including copper (which is hereinafter described as a copper film) in a wiring groove penetrating through the interlayer insulation film IL1, and exposing the plug PLG1 at the bottom thereof, each first-layer wiring L1 is formed. Herein, the layer including the first-layer wirings L1 and the interlayer insulation film IL1 at the same layer as the first-layer wirings L1 may be referred to as a first fine layer in the present specification.

Subsequently, over the interlayer insulation film IL1 including the first-layer wirings L1 formed therein, there are formed an interlayer insulation film IL2 and a plurality of second-layer wirings L2 in contact with the interlayer insulation film IL2. Specifically, over the interlayer insulation film IL1 including the first-layer wirings L1 formed therein, a barrier insulation film BI1 is formed. Over the barrier insulation film BI1, the interlayer insulation film IL2 is formed. The barrier insulation film BI1 is formed of, for example, a lamination film of a SiCN film and a SiOC film disposed over the SiCN film, a SiC film, an amorphous carbon film, a boron fluoride (BN) film, or a SiN film. The interlayer insulation film IL2 is formed of, for example, a SiOC film including a plurality of pores in the inside thereof. The size (diameter) of the pore will be described later by reference to FIG. 3. In the barrier insulation film BI1 and the interlayer insulation film IL2, a plurality of second-layer wirings L2 which are damascene wirings and a plurality of plugs PLG2 are formed in an embedded manner. Each second-layer wiring L2 is electrically coupled via the plug PLG2 with its corresponding first-layer wiring L1. The second-layer wirings L2 and the plugs PLG2 are each formed of a metal film mainly including, for example, copper. The barrier insulation film is a film formed between a metal wiring mainly including copper (such as the first-layer wiring L1) and an interlayer insulation film (such as the interlayer insulation film IL2), and having a function of preventing metal ions in the metal wiring from diffusing into the interlayer insulation film.

Then, as with the second-layer wirings L2, over the second-layer wirings L2, third-layer wirings L3 to fifth-layer wirings L5 are formed. The third-layer wirings L3 to fifth-layer wirings L5 are formed in contact with the interlayer insulation films IL3 to IL5, respectively. Specifically, over the interlayer insulation film IL2, and over the second-layer wirings L2, a barrier insulation film BI2 is formed in contact with the interlayer insulation film IL2 and the second-layer wirings L2. Over the barrier insulation film BI2, the interlayer insulation film IL3 is formed. Respective top surfaces of the second-layer wirings L2 and the interlayer insulation film IL2 are in contact with the barrier insulation film BI2.

The barrier insulation film BI2 is formed of any one of, for example, a lamination film of a SiCN film and a SiOC film disposed over the SiCN film, a SiC film, or a SiN film. The interlayer insulation film IL3 is formed of, for example, a SiOC film having pores. In the barrier insulation film BI2 and the interlayer insulation film IL3, the third-layer wirings L3 and the plugs PLG3 are formed in an embedded manner. The respective third-layer wirings L3 are electrically coupled with their corresponding second-layer wirings L2 via the plugs PLG3, respectively. The third-layer wirings L3 and the plugs PLG3 are each formed of, for example, a copper film.

Then, over the interlayer insulation film IL3 and over the third-layer wirings L3, a barrier insulation film BI3 is formed in contact with the interlayer insulation film IL3 and the third-layer wirings L3. Over the barrier insulation film BI3, an interlayer insulation film IL4 is formed. The barrier insulation film BI3 is formed of, for example, any one of a lamination film of a SiCN film and a SiOC film disposed over the SiCN film, a SiC film, or a SiN film. The interlayer insulation film IL4 is formed of, for example, a SiOC film having pores. In the barrier insulation film BI3 and the interlayer insulation film IL4, the fourth-layer wirings L4 and the plugs PLG4 are formed in an embedded manner. The fourth-layer wirings L4 are electrically coupled with their corresponding third-layer wirings L3 via the plugs PLG4, respectively. The fourth-layer wirings L4 and the plugs PLG4 are each formed of, for example, a copper film.

Further, over the interlayer insulation film IL4 and over the fourth-layer wirings L4, a barrier insulation film BI4 is formed in contact with the interlayer insulation film IL4 and the fourth-layer wirings L4. Over the barrier insulation film BI4, the interlayer insulation film IL5 is formed. The barrier insulation film BI4 is formed of, for example, any one of a lamination film of a SiCN film and a SiOC film disposed over the SiCN film, a SiC film, or a SiN film. The interlayer insulation film IL5 is formed of, for example, a SiOC film having pores. In the barrier insulation film BI4 and the interlayer insulation film IL5, fifth-layer wirings L5 and plugs PLG5 are formed in an embedded manner. The fifth-layer wirings L5 are electrically coupled with their corresponding fourth-layer wirings L4 via the plugs PLG5, respectively. The fifth-layer wirings L5 and the plugs PLG5 are each formed of, for example, a copper film. Herein, the second-layer wirings L2 to fifth-layer wirings L5 and the interlayer insulation films IL2 to IL5 formed at their respective same layers may be collectively referred to as a second fine layer in the present specification. In the interlayer insulation films IL2 to IL5 of the second fine layer, a plurality of wirings are formed, respectively.

Subsequently, over the interlayer insulation film IL5, and over the fifth-layer wirings L5, a barrier insulation film BI5 is formed in contact with the interlayer insulation film IL5 and the fifth-layer wirings L5. Over the barrier insulation film BI5, an interlayer insulation film IL6 is formed. The barrier insulation film BI5 is formed of, for example, any one of a lamination film of a SiCN film and a SiOC film disposed over the SiCN film, a SiC film, or a SiN film. The interlayer insulation film IL6 is formed of, for example, a SiOC film. In the barrier insulation film BI5 and the interlayer insulation film IL6, the sixth-layer wirings L6 and the plugs PLG6 are formed in an embedded manner. The sixth-layer wirings L6 are electrically coupled with their respective fifth-layer wirings L5 via the plugs PLG6, respectively. The sixth-layer wirings L6 and the plugs PLG6 are each formed of, for example, a copper film.

Then, over the interlayer insulation film IL6, a barrier insulation film BI6 is formed. Over the barrier insulation film BI6, an interlayer insulation film IL7 is formed. The barrier insulation film BI6 is formed of, for example, any one of a lamination film of a SiCN film and a SiOC film disposed over the SiCN film, a SiC film, or a SiN film. The interlayer insulation film IL7 is formed of, for example, a SiOC film. In the barrier insulation film BI6, and the interlayer insulation film IL7, the seventh-layer wirings L7 and the plugs PLG7 are formed in an embedded manner. The seventh-layer wirings L7 are electrically coupled with their corresponding sixth-layer wirings L6 via the plugs PLG7, respectively. The seventh-layer wirings L7 and the plugs PLG7 are each formed of, for example, a copper film. Herein, the sixth-layer wirings L6 and the seventh-layer wirings L7 may be collectively referred to as a semi-global layer in the present specification.

Further, over the interlayer insulation film IL7, a barrier insulation film BI7a is formed. Over the barrier insulation film BI7a, an interlayer insulation film IL8a is formed. Then, over the interlayer insulation film IL8a, an etching stop insulation film BI7b is formed. Over the etching stop insulation film BI7b, an interlayer insulation film IL8b is formed. The barrier insulation film BI7a is formed of, for example, any one of a lamination film of a SiCN film and a SiOC film, a SiC film, or a SiN film. The etching stop insulation film BI7b is formed of, for example, any one of a SiCN film, a SiC film, or a SiN film. The interlayer insulation film IL8a and the interlayer insulation film IL8b are each formed of, for example, a silicon oxide film ($SiO_2$ film), a SiOF film, or a TEOS film. In the barrier insulation film BI7a and the interlayer insulation film IL8a, plugs PLG8 are formed in an embedded manner. In the etching stop insulation film BI7b and the interlayer insulation film IL8b, eighth-layer wirings L8 are formed in an embedded manner. The eighth-layer wirings L8 are electrically coupled with their corresponding seventh-layer wirings L7 via the plugs PLG8, respectively. The eighth-layer wirings L8 and the plugs PLG8 are each formed of, for example, a copper film. Herein, the eighth-layer wirings L8 may be referred to as a global layer in the present specification.

Subsequently, over the interlayer insulation film IL8b, a barrier insulation film BI8 is formed. Over the barrier insulation film BI8, an interlayer insulation film IL9 is formed.

The barrier insulation film BI8 is formed of, for example, any one of a lamination film of a SiCN film and a SiOC film, a SiC film, or a SiN film. The interlayer insulation film IL9 is formed of, for example, a silicon oxide film ($SiO_2$ film), a SiOF film, or a TEOS film. In the barrier insulation film BI8 and the interlayer insulation film IL9, plugs PLG9 are formed in an embedded manner. Then, over the interlayer insulation film IL9, ninth-layer wirings L9 are formed. The ninth-layer wirings L9 are electrically coupled with their corresponding eighth-layer wirings L8 via the plugs PLG9, respectively. The plugs PLG9 and the ninth-layer wirings L9 are each formed of, for example, an aluminum film.

Over the ninth-layer wiring L9, a passivation film PAS serving as a surface protective film is formed. Through the opening formed in the passivation film PAS, a part of the ninth-layer wiring L9 is exposed. The exposed region of the ninth-layer wiring L9 serves as a pad PD. The passivation film PAS has a function of protecting the semiconductor device from penetration of impurities, and is formed of, for example, a silicon oxide film, and a silicon nitride film disposed over the silicon oxide film. Then, over the passivation film PAS, a polyimide film PI is formed. The polyimide film PI is also opened in a region including the pad PD formed therein. The pad PD is a region to be the electrode of a semiconductor chip of the semiconductor device shown in FIG. 1, and is a region to be electrically coupled via a metal wire or the like with other conductive members in a package in which the semiconductor chip is mounted.

The barrier insulation films BI1 to BI8 are each a liner film having a function of preventing the Cu (copper) in the copper film in contact with the bottom surface of each barrier insulation film from diffusing into the interlayer insulation film and the like over the barrier insulation film. The barrier insulation films BI1 to BI8 each also function as an etching stopper film for forming via holes in the interlayer insulation film over each barrier insulation film.

Figure 2:
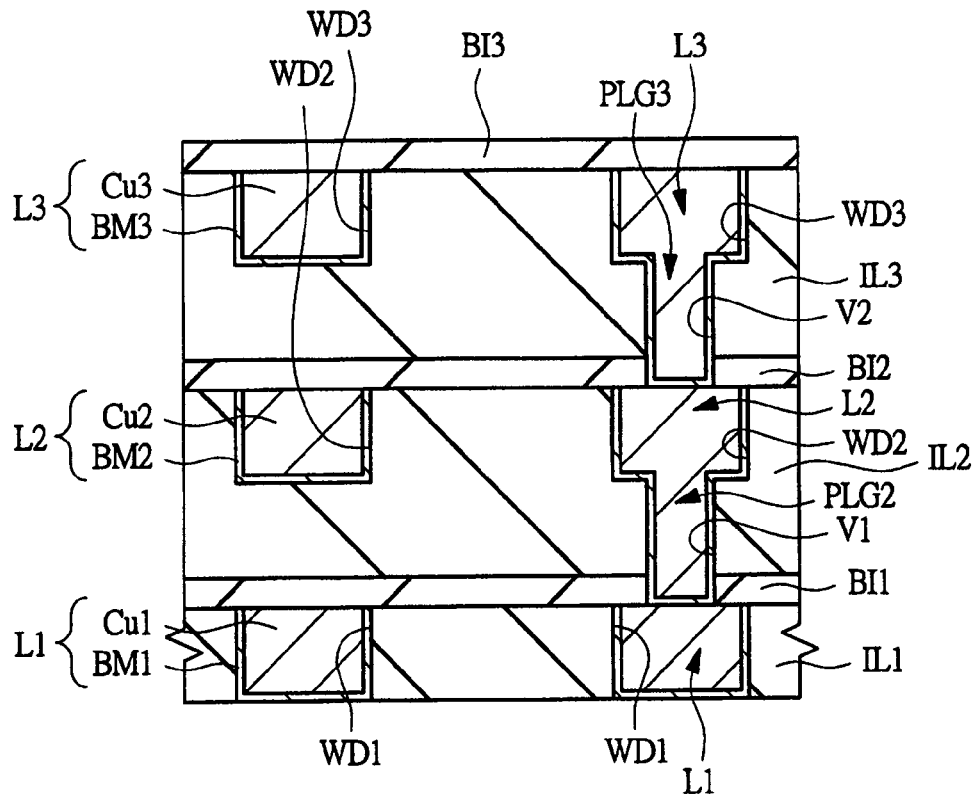
FIG. 2 is a cross-sectional view showing a part of the semiconductor device shown in FIG. 1 on an enlarged scale.

Then, FIG. 2 shows a cross-sectional view of the first to third wiring layers including the plural first-layer wirings L1, the plural second-layer wirings L2, and the plural third-layer wirings L3 shown in FIG. 1 on an enlarged scale. FIG. 2 shows the first-layer wirings L1 of the first fine layer, and the second-layer wirings L2 and the third-layer wirings L3 of the second fine layer formed over the first-layer wirings L1. In FIG. 2, the first-layer wirings L1 are formed in wiring grooves WD1 penetrating through the interlayer insulation film IL1 including, for example, a SiOC film. Specifically, the first-layer wiring L1 includes a barrier conductor film BM1 including a tantalum/tantalum nitride film (below, the tantalum/tantalum nitride film represents a film including tantalum nitride and tantalum formed over the tantalum nitride) formed over the inner wall of the wiring groove WD1, a titanium/titanium nitride film, or the like, and a copper film Cu1 formed over the barrier conductor film BM1 and formed in such a manner as to fill the wiring groove.

Thus, in the plural wiring grooves WD1 formed in the interlayer insulation film IL1, the copper film is not directly formed, but the barrier conductor film BM1 is formed. This is in order to prevent the copper forming the copper film from diffusing into the silicon forming the semiconductor substrate 1S, or the interlayer insulation film such as the interlayer insulation film IL1 by a heat treatment or the like. The diffusion constant of copper atoms into silicon is relatively large. Therefore, the copper atoms which have diffused into the interlayer insulation film also diffuse with ease into the silicon forming the semiconductor substrate 1S. In this case, over the semiconductor substrate 1S, semiconductor elements such as MISFETs Qn are formed. Thus, diffusion of copper atoms in the formation region thereof causes the characteristic deterioration of the semiconductor element typified by breakdown voltage defect. Namely, copper atoms diffuse into the interlayer insulation film with a high diffusion constant, which causes the deterioration of inter-wiring TDDB characteristics. For this reason, the barrier conductor film BM1 is disposed in order to prevent diffusion of copper atoms from the copper film forming the first-layer wiring. In other words, the barrier conductor film BM1 is a film having a function of preventing diffusion of copper atoms. Incidentally, as the material for the barrier conductor film, other than titanium or tantalum, there may be used ruthenium (Ru), manganese (Mn), or a compound thereof, or the like.

Then, as shown in FIG. 2, over the interlayer insulation film IL1 including the first-layer wirings L1 formed therein, a barrier insulation film BI1 is formed. Over the barrier insulation film BI1, the interlayer insulation film IL2 is formed. At this step, the barrier insulation film BI1 includes a lamination film of a SiCN film and a SiOC film. The interlayer insulation film IL2 includes, for example, a SiOC film having a plurality of pores in the inside thereof. In the wiring grooves WD2 reaching to a halfway depth of the interlayer insulation film IL2, and in the via holes V1 penetrating through the barrier insulation film BI1 and the interlayer insulation film IL2, and reaching the top surfaces of the first-layer wirings L1, the second-layer wirings L2 and the plugs PLG2 are embedded, respectively. The second-layer wirings L2 and the plugs PLG2 are each also formed of a lamination film of a barrier conductor film BM2 and a copper film Cu2 as with the first-layer wirings L1. The second-layer wirings L2 are a plurality of damascene wirings embedded in the respective insides of the plural wiring grooves WD2 formed in the top surface of the interlayer insulation film IL2. As with the first-layer wirings L1, between the second-layer wirings L2 and the interlayer insulation film IL2, the barrier conductor film BM2 is formed.

Further, as with the barrier insulation film BI1, over the interlayer insulation film IL2, the barrier insulation film BI2 is formed. Over the barrier insulation film BI2, the interlayer insulation film IL3 is formed. At this step, the barrier insulation film BI3 includes a lamination film of a SiCN film and a SiOC film. The interlayer insulation film IL3 includes, for example, a SiOC film having pores. In a plurality of wiring grooves WD3 reaching to a halfway depth of the interlayer insulation film IL3, and in via holes V2 penetrating through the barrier insulation film BI2 and the interlayer insulation film IL3, and reaching the top surfaces of the second-layer wirings L2, a plurality of third-layer wirings L3 and a plurality of plugs PLG3 are embedded, respectively. Each third-layer wiring L3 and each plug PLG3 are also formed of a lamination film of a barrier conductor film BM3 and a copper film Cu3.

Incidentally, herein, the layer having the plural the sixth-layer wirings L6 and the seventh-layer wirings L7 in which wirings are disposed at a larger minimum interval (wiring pitch) than the minimum interval (wiring pitch) between the plural second-layer wirings L2, the minimum interval between the plural third-layer wirings L3, the minimum interval between the plural the fourth-layer wirings L4, and the minimum interval between the plural the fifth-layer wirings L5 shown in FIG. 1 is referred to as the semi-global layer. The layer having the first-layer wirings L1 to fifth-layer wirings L5 with a narrower wiring pitch than that of the semi-global layer is referred to as the fine layer. Particularly, the layer having the plural first-layer wirings L1 is referred to as a first fine layer. The layer having the second-layer wirings L2 to fifth-layer wirings L5 is referred to as a second fine layer. The wiring pitch in the second fine layer is narrower than that of the semi-global layer. For this reason, it is important for the interlayer insulation film in the second fine layer to have a lower relative dielectric constant than that of the interlayer insulation film in the semi-global layer. Further, the wiring pitch in the second fine layer is narrower than that of the semi-global layer. For this reason, in the second fine layer, it is necessary to prevent the reduction of the reliability of the interlayer insulation film by suppressing the variations in relative dielectric constant of the interlayer insulation film; and suppressing the increase in relative dielectric constant of the interlayer insulation film due to the process damages; and by other procedures.

Figure 3:
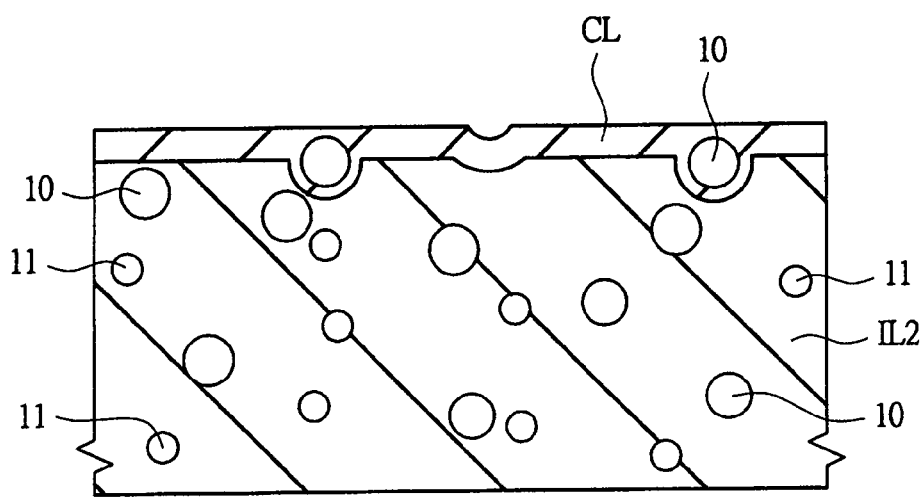
FIG. 3 is a cross-sectional view showing a part of the semiconductor device shown in FIG. 2 on an enlarged scale.
Figure 4:
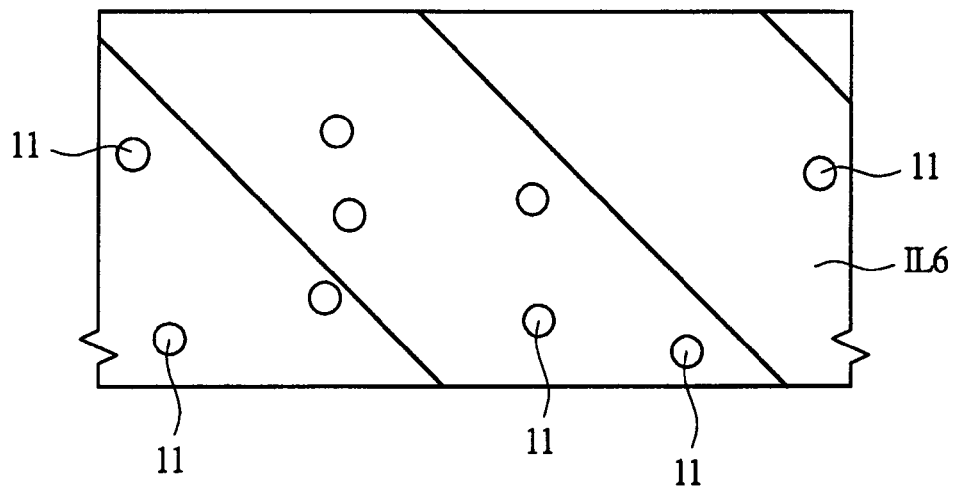
FIG. 4 is a cross-sectional view showing a part of the semiconductor device shown in FIG. 1 on an enlarged scale.

Herein, FIG. 3 shows a cross-sectional view of the interlayer insulation film IL2 of FIG. 2 on an enlarged scale. Further, FIG. 4 shows a cross-sectional view of the interlayer insulation film IL6 shown in FIG. 1 on an enlarged scale. As shown in FIG. 3, in the interlayer insulation film IL2, a plurality of pores 10 are formed. Further, a plurality of pores 11 with a smaller mean diameter than that of the pores 10 are formed. Still further, as shown in FIG. 4, in the interlayer insulation film IL6, a large number of pores 11 with a smaller mean diameter than that of the pores 10 (see FIG. 3) are formed. However, as distinct from the interlayer insulation film IL2 (see FIG. 3), in the interlayer insulation film IL6, the pores 10 (see FIG. 3) are not formed.

The pores 10 shown in FIG. 3 are voids formed in the following manner. With a plasma CVD method or the like described later, an insulation film having a plurality of pores including a porogen gas therein is formed. Then, the porogen is eliminated from the inside of the insulation film. As a result, voids are formed at the positions at each of which the porogen was formed. On the other hand, the pores 11 are voids formed upon forming an insulation film such as a SiOC film with a CVD method or the like regardless of whether porogen is used or not.

In the present embodiment, the interlayer insulation film (e.g., the interlayer insulation film IL6 shown in FIG. 4) in the inside of which the pores 11 (see FIG. 4) are formed, but the pores 10 (see FIG. 3) are not formed is defined as a Low-k film. Whereas, the interlayer insulation film (e.g., the interlayer insulation film IL2 shown in FIG. 3) including the pores 11 and the pores 10 formed in the inside thereof, and having a lower relative dielectric constant than that of the Low-k film is defined as a porous Low-k film. Based on the definitions, these films will be described. The Low-k film forms, for example, the interlayer insulation film stacked over the interlayer insulation film IL5 of the second fine layer shown in FIG. 1. Whereas, the porous Low-k film forms the interlayer insulation films IL2 to IL5 of the second fine layer. This is for the following reason: preferably, the wirings in the second fine layer are disposed at a narrower wiring pitch than the wiring pitch (the minimum interval between the wirings) in the semi-global layer such as the sixth-layer wirings L6 or the seventh-layer wirings L7; and the interlayer insulation film in the second fine layer has a lower relative dielectric constant than that of the interlayer insulation film in the semi-global layer. For the fine layer and the semi-global layer, an interlayer insulation film having a low relative dielectric constant is used. This can prevent the occurrence of the wiring delay proportional to the product of the resistance of wirings and the parasitic capacitance of wirings in the semiconductor device. Further, by using an interlayer insulation film with a low relative dielectric constant, for example, it is possible to increase the breakdown voltage between the second-layer wirings L2.

Further, the interlayer insulation film IL3, and the interlayer insulation films IL4 and IL5 shown in FIG. 1 have the same structure as that of the interlayer insulation film IL2 of the porous Low-k film shown in FIG. 3. Whereas, the interlayer insulation films IL1 and IL7 shown in FIG. 1 have the same structure as that of the interlayer insulation film IL6 of the Low-k film shown in FIG. 4. Namely, in the interlayer insulation film IL3, and the interlayer insulation films IL4 and IL5 of the second fine layer, the pores 10 and the pores 11 shown in FIG. 3 are formed, respectively. Whereas, in the interlayer insulation film IL1 of the first fine layer, and in the interlayer insulation film IL7 of the semi-global layer, the pores 11 are formed, but the pores 10 are not formed, respectively.

Incidentally, in the interlayer insulation film, a plurality of pores may come in contact with each other to form a large number of pores having one irregular shape. For this reason, the mean diameter of pores referred to in the present application denotes, when the plurality of pores in the interlayer insulation film are regarded as spheres each having the same volume as that of each pore, the mean value of the diameters of the spheres.

Herein, the mean diameter of the pores 10 shown in FIG. 3 is 1.0 nm or more and less than 1.7 nm. The mean diameter of the pores 11 is 0.6 nm or more and less than 1.0 nm. The mean diameter of the pores 10 and the pores 11 is 1.0 nm or more and less than 1.45 nm.

For example, the mean diameter of the pores 10 is 1.68 nm, and the mean diameter of the pores 11 is 0.9 nm. In this case, the mean diameter of the pores 10 and the pores 11 is 1.29 nm, and is the mean diameter within the foregoing range of 1.0 nm or more and less than 1.45 nm.

As the measurement method of the mean diameter of pores, there is a method using a positron/positronium lifetime measurement system using a low-speed positron beam. With this measurement method, the pores in the interlayer insulation film are irradiated with a positron beam to generate positronium. Then, the time taken for the positronium to annihilate is measured, thereby to measure the diameter of the pore. The larger the diameter of the pore is, the longer the time to positronium annihilation is. For the measurement device, there is disclosed a measurement device using a low-speed positron beam in, for example, Japanese Unexamined Patent Publication No. 2008-232759.

Then, a description will be given to the effects of the semiconductor device of the present embodiment.

Figure 41:
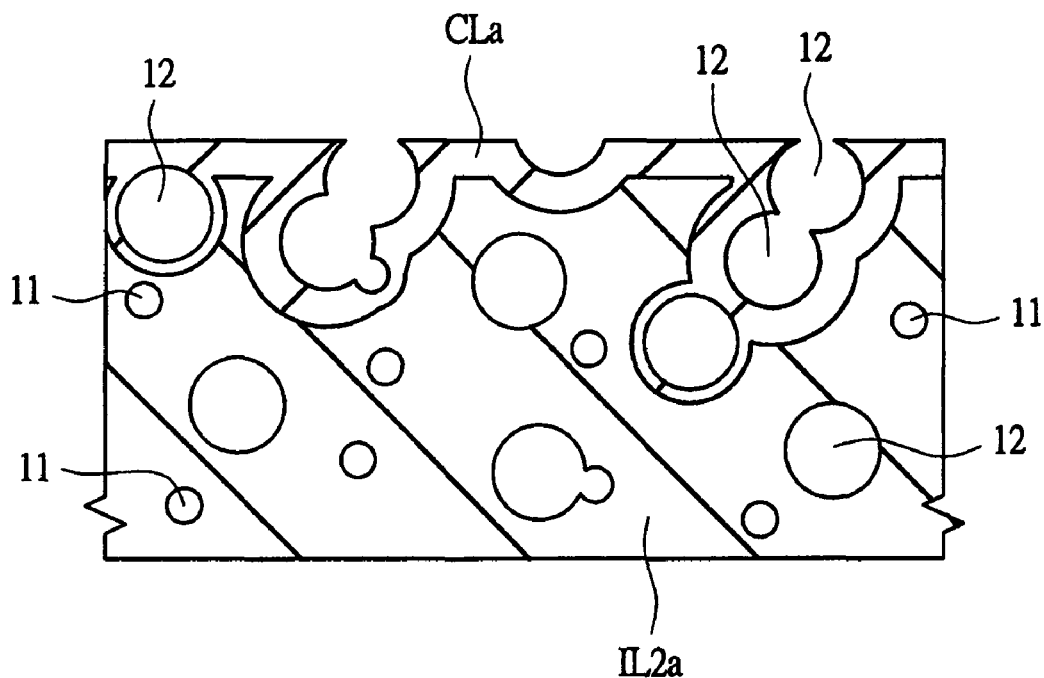
FIG. 41 is a cross-sectional view showing a part of a semiconductor device shown as a modified example of FIG. 3 on an enlarged scale.

First, as a modified example of FIG. 3, during the deposition step for forming a porous Low-k film using porogen with a CVD method, the flow rate of porogen described later is set larger than that in the present embodiment. This results in an interlayer insulation film in the inside of which a plurality of pores with a relatively large mean diameter are formed. FIG. 41 shows the cross-sectional view of the interlayer insulation film on an enlarged scale. As shown in FIG. 41, in the interlayer insulation film IL2a, there are formed pores 12 with a larger mean diameter than that of the pores 10 shown in FIG. 3, and pores 11 with a smaller mean diameter than that of the pores 10 shown in FIG. 3. Namely, the mean diameter of the pores 12 is 1.7 nm or more. For example, the mean diameter of the pores 11 is 0.9 nm, and the mean diameter of the pores 12 is 2.4 nm. Therefore, the mean diameter of the pores 11 and the pores 12 is 1.65 nm, which is larger than the value (e.g., 1.29 nm) within the range of 1.0 nm or more and less than 1.45 nm of the mean diameter of the pores 10 and the pores 11 shown in FIG. 3.

Figure 21:
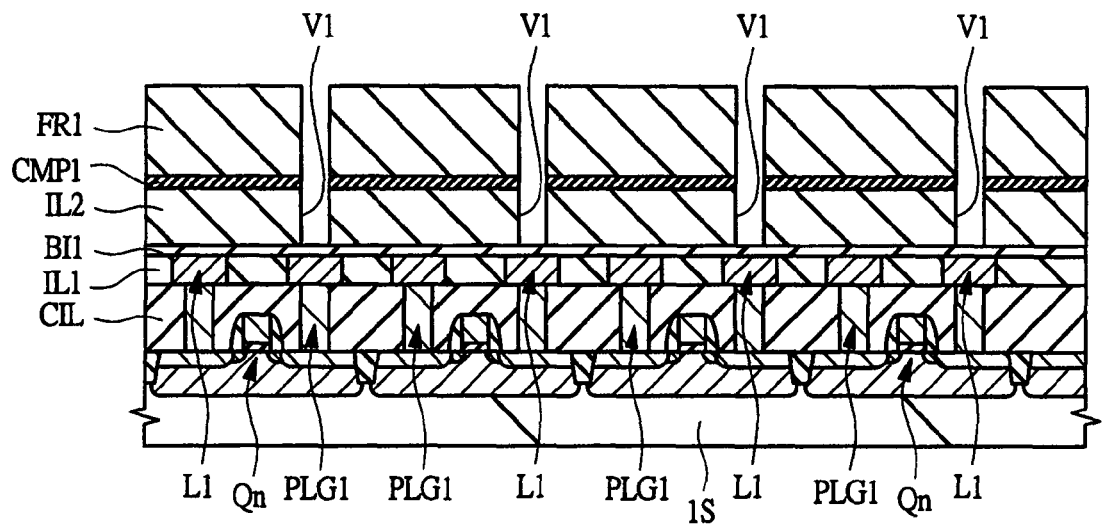
FIG. 21 is a cross-sectional view showing a method for manufacturing the semiconductor device following FIG. 18.
Figure 23:
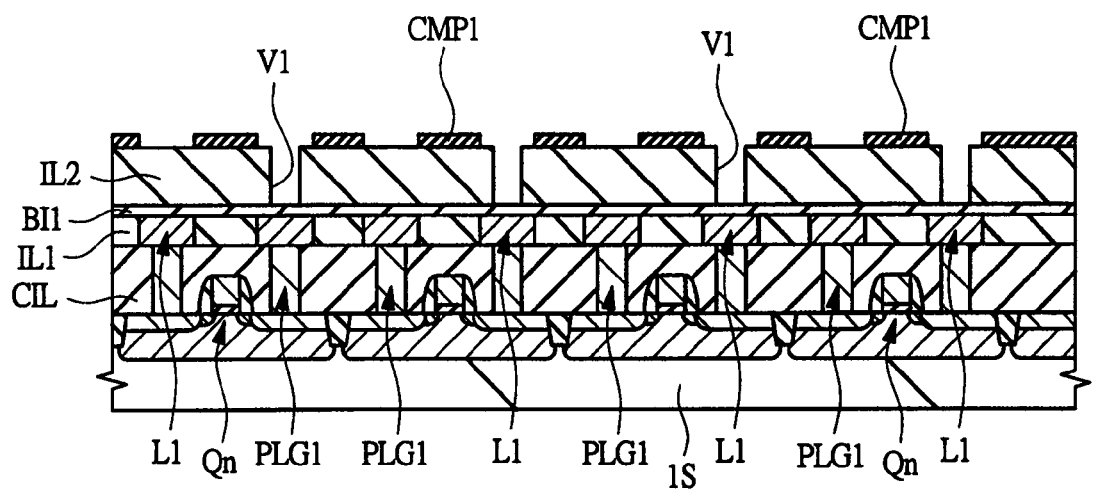
FIG. 23 is a cross-sectional view showing a method for manufacturing the semiconductor device following FIG. 22.
Figure 24:
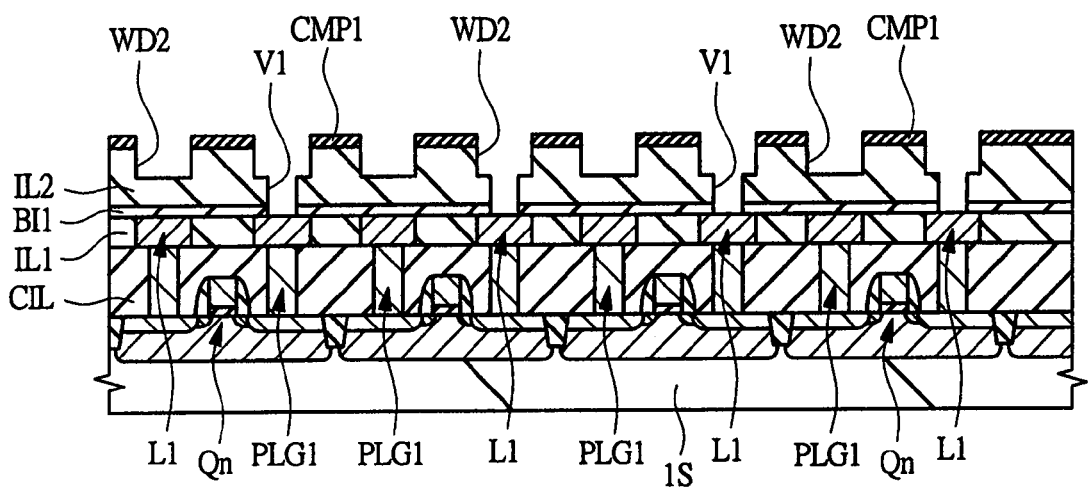
FIG. 24 is a cross-sectional view showing a method for manufacturing the semiconductor device following FIG. 23.
Figure 27:
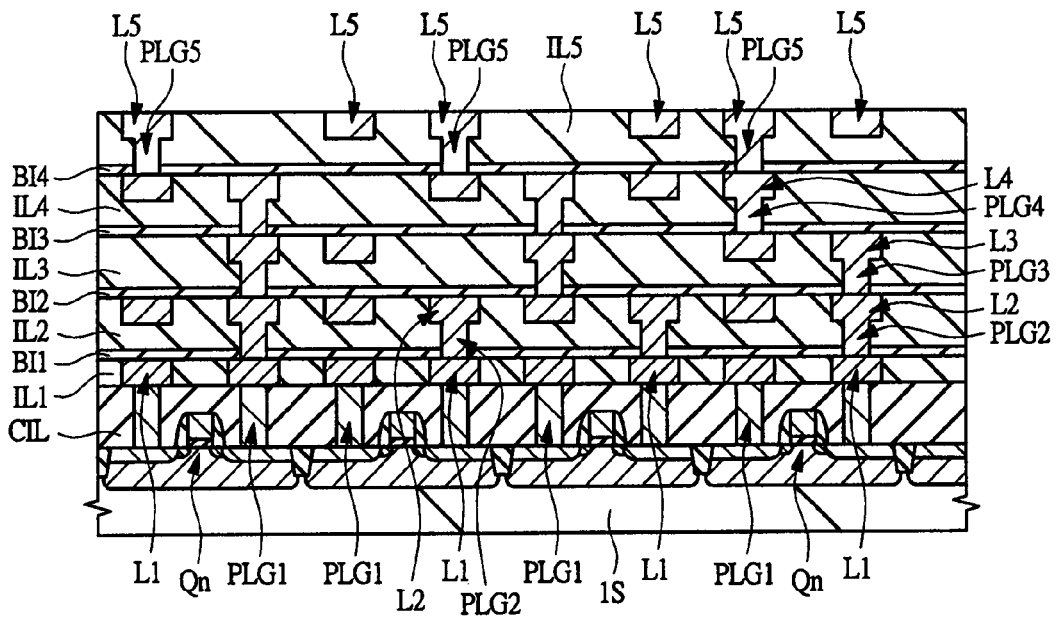
FIG. 27 is a cross-sectional view showing a method for manufacturing the semiconductor device following FIG. 26.
Figure 28:
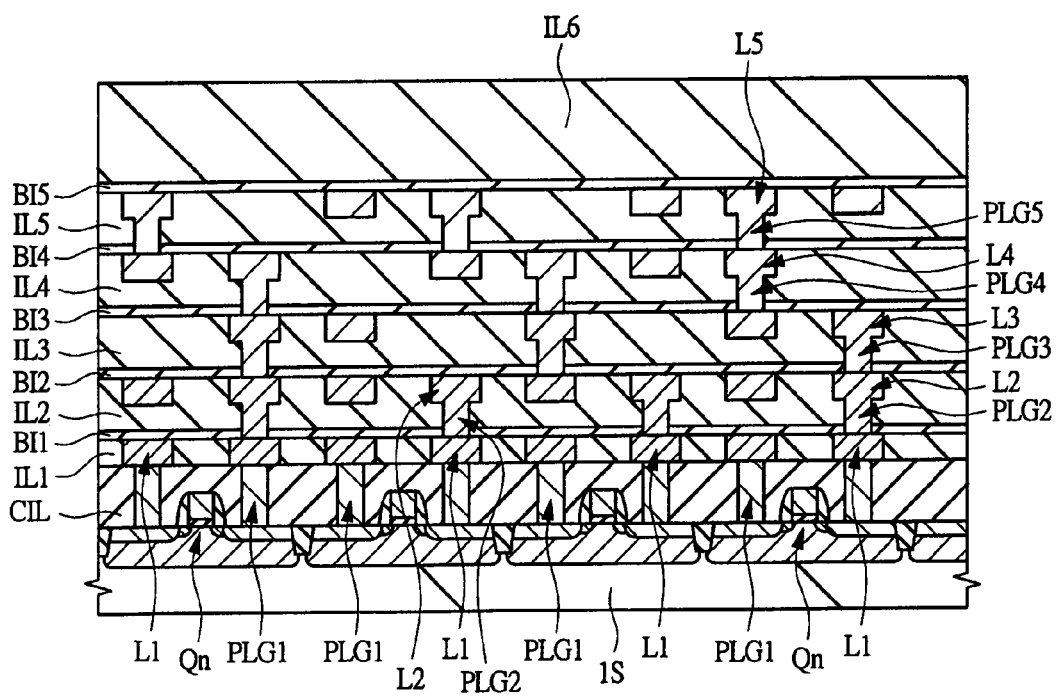
FIG. 28 is a cross-sectional view showing a method for manufacturing the semiconductor device following FIG. 27.

Herein, the porous Low-k film has a property of, by being exposed to a plasma, a chemical, or the like in an etching step, an ashing step, a cleaning step, a deposition step, a polishing step by CMP, or the like, being changed in film quality of the surface exposed to the plasma, the chemical, or the like. Specifically, the surfaces of the interlayer insulation films IL2 to IL5 shown in FIG. 1 are damaged in the etching step described by reference to FIGS. 21, 23, and 24 shown later, the ashing step described by reference to FIGS. 22 and 23, and the cleaning step after the ashing step. Further, in the cleaning step described by reference to FIGS. 27 and 28 shown later, the CMP step described by reference to FIG. 26, and the deposition step of the barrier conductor film or barrier insulation film BI2 over the interlayer insulation film, and the like described by reference to FIGS. 18, 25, and 27, the surface is damaged.

In the steps, the damages on the interlayer insulation film by the etching step or the ashing step for forming wiring grooves or via holes in the interlayer insulation film are particularly larger than the damages on the interlayer insulation film by the CMP step, the cleaning step, or the like. As a comparative example, the modified layer CLa shown in FIG. 41 is a layer formed over the surface of the interlayer insulation film IL2a which has been damaged and changed in film quality.

The interlayer insulation film exposed to a plasma, a chemical, or the like (damaged) is changed in material quality of the surface thereof, and is enhanced in hydrophilicity to become more likely to absorb water. Incidentally, the damaged interlayer insulation film is enhanced in hydrophilicity for the following reason. The methyl group ($CH_3$ group) with a high hydrophobicity, bonded to the interlayer insulation film is exposed to a plasma, a chemical, or the like. As a result, the methyl group is substituted with an OH group with a high hydrophilicity. To the modified layer of the interlayer insulation film to which an OH group is bonded, a moisture tends to adsorb upon exposure of the semiconductor substrate to an atmosphere.

Figure 42:
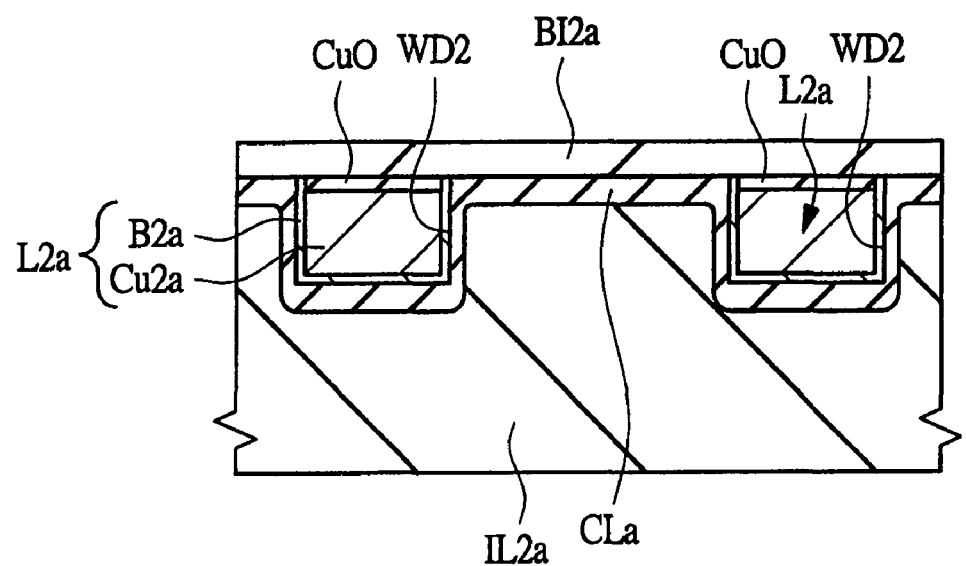
FIG. 42 is a cross-sectional view showing a part of a semiconductor device shown as a comparative example on an enlarged scale.

Herein, the cross-sectional view of the wiring layer using the interlayer insulation film IL2a shown in FIG. 41 on an enlarged scale is shown as a comparative example in FIG. 42. The barrier insulation film BI2a, the second-layer wirings L2a, the copper film Cu2a, the barrier conductor film B2a, and the interlayer insulation film IL2a shown in FIG. 42 correspond to the barrier insulation film BI2, the second-layer wirings L2, the copper film Cu2, the barrier conductor film B2, and the interlayer insulation film IL2 shown in FIG. 2, respectively. As with the interlayer insulation film IL2a shown in FIG. 41, over the top surface of the interlayer insulation film IL2, and the inner walls and the bottom surfaces of the wiring grooves WD2, a modified layer CLa is formed. In the modified layer CLa, a moisture is contained in a larger amount than that of the interlayer insulation film IL2a. The copper oxide film CuO formed over the top surface of the copper film Cu2a is a layer containing copper oxide oxidized by the moisture in the modified layer CLa.

When the modified layer CLa is formed over a deeper region from the top surface of the interlayer insulation film IL2a, the copper oxide film CuO becomes more likely to be formed. When the copper oxide film CuO is formed, the adhesion between the copper oxide film CuO and the barrier insulation film BI2a over the copper oxide film CuO is reduced. This results in reduction of the wiring EM lifetime of the second-layer wirings L2a. Incidentally, the term "EM" denotes electromigration that metal components forming the metal wiring migrate over and across the inside of the non-metal medium under the effect of the electric field. The electromigration forms voids in the metal wiring, so that an increase in resistance value or disconnection of the metal wiring occurs.

Further, the moisture eliminated from the modified layer CLa oxidizes the barrier conductor film B2a. As a result, the function of the barrier conductor film as a barrier film is reduced, so that copper ions in the copper film Cu2a become more likely to diffuse into the interlayer insulation film IL2a surrounding the second-layer wirings L2a. Thus, in the interlayer insulation film IL2a, the damaged modified layer CL is formed, so that a moisture is adsorbed to the modified layer CL. Further, in the interlayer insulation film IL2a, copper diffuses, resulting in a reduction of the inter-wiring TDDB lifetime between the second-layer wirings L2a. Still further, the same cause unfavorably reduces the breakdown voltage between the second-layer wirings L2. Incidentally, the inter-wiring TDDB denotes the following property: when the oxide films (corresponding to the interlayer insulation films IL2 to IL5 shown in FIG. 1 in the present embodiment) are continuously applied with a voltage, the ratio of breakage of the oxide film increases with time.

Further, when the barrier conductor film B2a is oxidized as described above, the adhesion between the interlayer insulation film IL2a and the second-layer wirings L2a in contact with the barrier conductor film B2a is unfavorably reduced.

These problems can be prevented by reducing the region in which the modified layer CLa is formed. As shown in FIG. 41, the modified layer CLa is exposed at the top surface of the interlayer insulation film IL2a, and formed in a deep region from the top surface of the interlayer insulation film IL2a along the inner walls of the pores 12 which are portions of the surface of the interlayer insulation film IL2a. This indicates that the pores 12 formed in the top surface of the interlayer insulation film IL2a increases the region in which the modified layer CLa is formed. Further, when there are formed other pores 12 in contact and integral with the pores 12 formed in the top surface of the interlayer insulation film IL2a, the region in which the modified layer CLa is formed is further expanded.

Thus, in order to prevent the formation of the pores 12 exposed at the top surface of the interlayer insulation film IL2a, and the pores 12 coupled thereto, in the present embodiment, the mean diameter of pores in the interlayer insulation film formed in the second fine layer is set at less than 1.45 nm. As a result, as compared with the semiconductor device of the comparative example, the mean diameter of pores formed in the interlayer insulation film is smaller. Namely, as shown in FIG. 3, in the interlayer insulation film IL2, there are formed the pores 10 with a smaller mean diameter than that of the pores 12 shown in FIG. 41. Incidentally, the mean diameter of the pores 11 shown in FIG. 3 is 0.6 or more and less than 1.0 nm, and the mean diameter of the pores 10 is 1.0 nm or more and less than 1.7 nm. Accordingly, the mean diameter of the pores 10 and the pores 11 is less than 1.45 nm.

Herein, the mean diameter of the pores 10 is set at 1.0 nm or more and less than 1.7 nm for the following reason. When the mean diameter of the pores 10 in the interlayer insulation film is less than 1.0 nm, the dielectric constant of the interlayer insulation film increases, and becomes unsuitable as the interlayer insulation film of the fine layer. Further, a plurality of pores having a mean diameter of 1.7 nm or more tend to be coupled with each other in the interlayer insulation film. This causes an expansion of the modified layer formation region.

The pores 10 (see FIG. 3) with a smaller mean diameter than that of the pores 12 shown in FIG. 41 have a low possibility of being exposed at the top surface of the interlayer insulation film IL2. Further, even when the pores 10 are exposed at the top surface of the interlayer insulation film IL2, the modified layer CL formed thereby over the surface of the interlayer insulation film IL2 along the inner walls of the pores 10 has a smaller depth than that when formed along the inner walls of the pores 12 with a larger mean diameter as shown in FIG. 41. For this reason, the region in which the modified layer CL is formed can be reduced. Whereas, the pores 10 have a smaller mean diameter than that of the pores 12 shown in FIG. 41, and hence the plural pores 10 shown in FIG. 3 are less likely to be in contact and integral with each other. Accordingly, the pores 10 have a low possibility of being coupled with each other from the top surface of the interlayer insulation film IL2, and expanding the modified layer CL to a deep region.

Herein, the mean diameter of the pores 10 in the present embodiment shown in FIG. 3 is, for example, 1.68 nm. The mean diameter of the pores 11 is, for example, 0.9 nm. In this case, the mean diameter of the pores 10 and the pores 11 is 1.29 nm.

In the present embodiment, the mean diameter of pores in the interlayer insulation film which is a porous Low-k film is set at less than 1.45 nm. This can prevent the formation of the modified layer from the surface to a deep region of the interlayer insulation film. Namely, by inhibiting the formation of the moisture-containing modified layer CL, it is possible to prevent the oxidation of the barrier film and the main conductor film forming respective wirings. This can prevent the deterioration of breakdown voltage between respective wirings. As a result, it is possible to extend the EM lifetime of wirings formed adjacent to the interlayer insulation film, and the inter-wiring TDDB lifetime of the wirings.

Thus, with the semiconductor device in the present embodiment, by extending the EM lifetime of the wirings formed adjacent to the interlayer insulation film, it is possible to improve the reliability of the interlayer insulation film. Further, by extending the inter-wiring TDDB lifetime of the wirings formed adjacent to the interlayer insulation film, it is possible to improve the reliability of the interlayer insulation film. As a result, it is possible to improve the reliability of the semiconductor device.

Further, with the semiconductor device in the present embodiment, by preventing the relative dielectric constant of the interlayer insulation film from being increased by process damages, it becomes possible to improve the electric characteristics of the interlayer insulation film. Further, with the semiconductor device in the present embodiment, by preventing the metals in the wirings from diffusing into the interlayer insulation film, it becomes possible to improve the breakdown voltage between wirings. This enables an improvement of the electric characteristics of the interlayer insulation film. As a result, it is possible to improve the performances of the semiconductor device.

Figure 43:
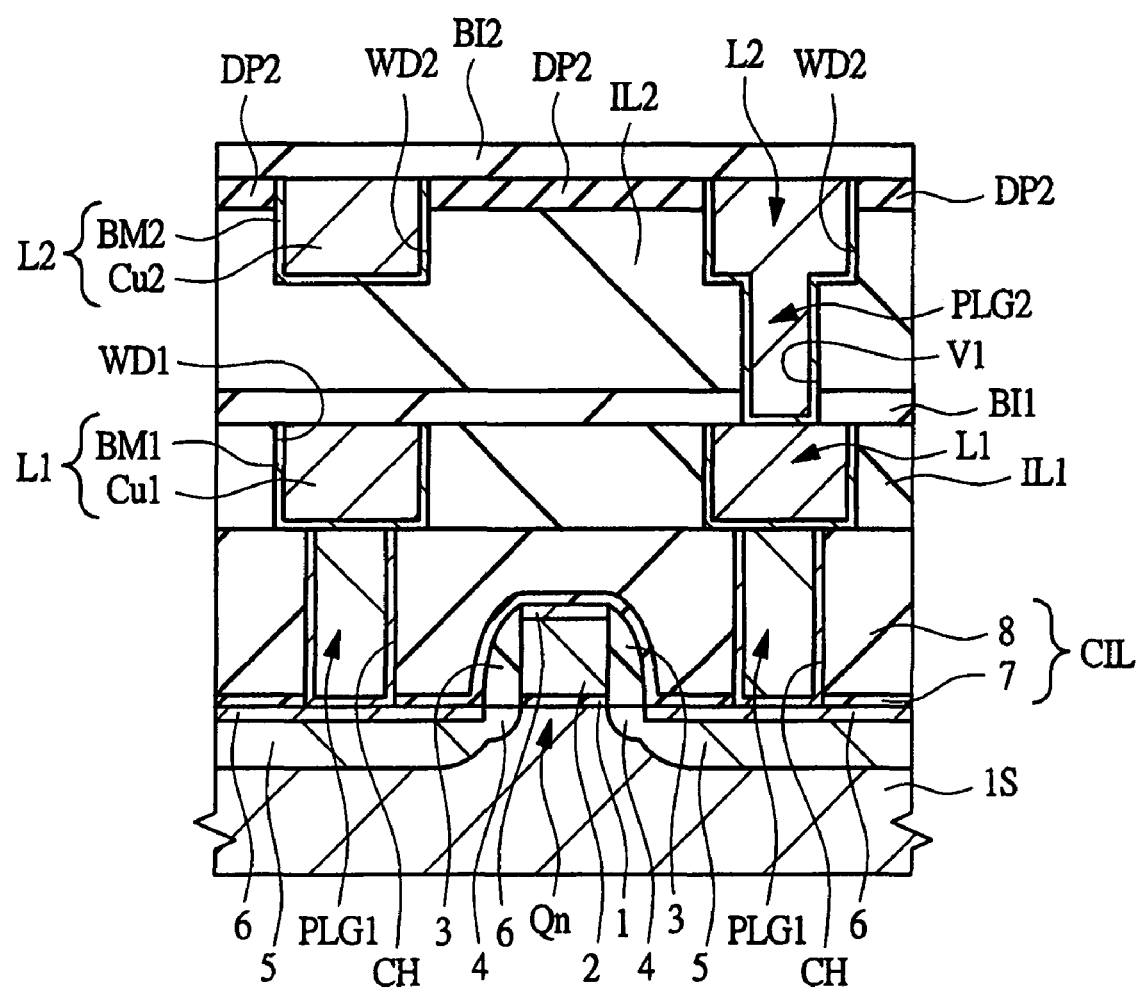
FIG. 43 is a cross-sectional view of the semiconductor device shown as the comparative example.

Incidentally, as a method for reducing the damages on the surface of the interlayer insulation film IL2a shown in FIG. 41, the following method can be considered: after the formation of an interlayer insulation film, a damage protective film (cap film) for protecting the interlayer insulation film is formed over the interlayer insulation film. Herein, FIG. 43 shows a cross-sectional view of a semiconductor device in which over the interlayer insulation film of a porous Low-k film, a damage protective film is formed as a comparative example. As shown in FIG. 43, over the interlayer insulation film IL2 over the first-layer wirings L1 electrically coupled with a MISFET Qn formed over the semiconductor substrate 1S, a damage protective film DP2 is formed.

Namely, over the semiconductor substrate 1S, the gate electrode 2 is formed via the gate insulation film 1. Over the opposite side surfaces of the gate insulation film 1 and the gate electrode 2, sidewalls 3 including an insulation film is formed. In portions of the main surface of the semiconductor substrate 1S underlying the sidewalls 3, impurity diffusion regions 4 are formed. In portions of the main surface of the semiconductor substrate 1S except for the portions underlying the gate electrode 2 and the sidewalls 3, there are formed impurity diffusion regions 5 deeper than the impurity diffusion regions 4. Over the top surfaces of the impurity diffusion regions 5 and the gate electrode 2, silicide layers 6 are formed. The main surface of the semiconductor substrate 1S including the gate electrode 2, the sidewalls 3, and the silicide layers 6 is covered with a contact interlayer insulation film CIL including an etching stopper film 7 and an insulation film 8 sequentially deposited. In the contact interlayer insulation film CIL, there are opened contact holes CH penetrating through the contact interlayer insulation film CIL, and exposing the top surfaces of the silicide layers 6. In each contact hole CH, a contact plug PLG1 is formed.

Over the contact interlayer insulation film CIL, there are sequentially formed the interlayer insulation film IL1, the barrier insulation film BI1, the interlayer insulation film IL2, the damage protective film DP2, and the barrier insulation film BI2. In each wiring groove WD1 penetrating through the interlayer insulation film IL1, a copper film Cu1 is embedded via a barrier conductor film BM1. The barrier conductor film BM1 and the copper film Cu1 form the first-layer wiring L1. Further, in each wiring groove WD2 reaching from the top surface of the damage protective film DP2 to a halfway depth of the interlayer insulation film IL2, a copper film Cu2 is embedded via a barrier conductor film BM2. The barrier conductor film BM2 and the copper film Cu2 form the second-layer wiring L2. Whereas, in each via hole V1 reaching from the bottom surface of the second-layer wiring L2 to the top surface of the first-layer wiring L1, the copper film Cu2 is embedded via the barrier conductor film BM2. The barrier conductor film BM2 and the copper film Cu2 form the second-layer wiring L2.

The damage protective film DP2 includes a SiOC film formed over the interlayer insulation film IL2 after the formation of the interlayer insulation film IL2 with a CVD method. The damage protective film DP2 has a higher mechanical strength and a higher relative dielectric constant than those of the interlayer insulation film IL2 which is a porous Low-k film. In the damage protective film DP2 and the interlayer insulation film IL2, there are formed the wiring grooves WD2 reaching from the top surface of the damage protective film DP2 to a halfway depth of the interlayer insulation film IL2. In each wiring groove WD, the second-layer wiring L2 is formed.

The damage protective film DP2 is a film not including such large pores 10 or 12 (see FIG. 3 or 41) as included in the interlayer insulation film IL2, and having a high relative dielectric constant. The damage protective film DP2 has a function of preventing the interlayer insulation film IL2 from being damaged by the etching, cleaning, ashing, or deposition step.

In the semiconductor device of the comparative example shown in FIG. 43, the damage protective film DP2 is formed over the porous Low-k film. As a result, the interlayer insulation film underlying the damage protective film is prevented from being damaged. This prevents the reduction of the inter-wiring TDDB lifetime or the wiring EM lifetime, or the reduction of the breakdown voltage between wirings. However, the damage protective film is a film with a high relative dielectric constant. For this reason, the formation of the damage protective film results in an increase in relative dielectric constant of the whole semiconductor device. Thus, the effects of use of the porous Low-k film with a low relative dielectric constant are lost, which impedes the speedup of the semiconductor device.

In contrast, in the present embodiment, by suppressing the size of the pores in the porous Low-k film, it is possible to prevent the porous Low-k film from being damaged. Therefore, the damage protective film is not formed. In other words, over the interlayer insulation film including a porous Low-k film, and over the wirings formed in the wiring grooves in the top surface of the interlayer insulation film, the barrier insulation film is formed. The respective top surfaces of the interlayer insulation film and the wirings are in contact with the barrier insulation film.

In the present embodiment, the damage protective film is not formed over the porous Low-k film. This prevents the occurrence of the following: due to the presence of the damage protective film with a higher relative dielectric constant than that of the porous Low-k film, the relative dielectric constant of the whole semiconductor device is increased. Further, in the present embodiment, it is possible to reduce the number of steps of forming the damage protective film. For this reason, it is possible to simplify the manufacturing steps of the semiconductor device.

Incidentally, in the present embodiment, a description was given to the case where for the second fine layer, a porous Low-k film was used. However, it is also acceptable that the interlayer insulation film such as the semi-global layer formed over the first fine layer or the second fine layer is formed of a porous Low-k film.

Further, conceivably, in the interlayer insulation film forming the semi-global layer over the second fine layer, there are formed pores with a further larger mean diameter than that of the pores in the interlayer insulation film of the second fine layer. In this case, the semi-global layer has pores with a larger mean diameter than that of the pores in the second fine layer. For this reason, at the surface of the interlayer insulation film, a modified layer due to process damages tends to be formed. In the present embodiment, a description was given to the semiconductor device in which over the top surface of the interlayer insulation film, the damage protective film was not formed. However, for the foregoing reason, in the semi-global layer over the second fine layer, or the like, over the interlayer insulation film including a Low-k film or a porous Low-k film, the damage protective film may be formed.

Then, the reason why the mean diameter of pores in the porous Low-k film is set at 1.0 nm or more and less than 1.45 nm will be described by reference to FIGS. 5 to 9.

Figure 5:
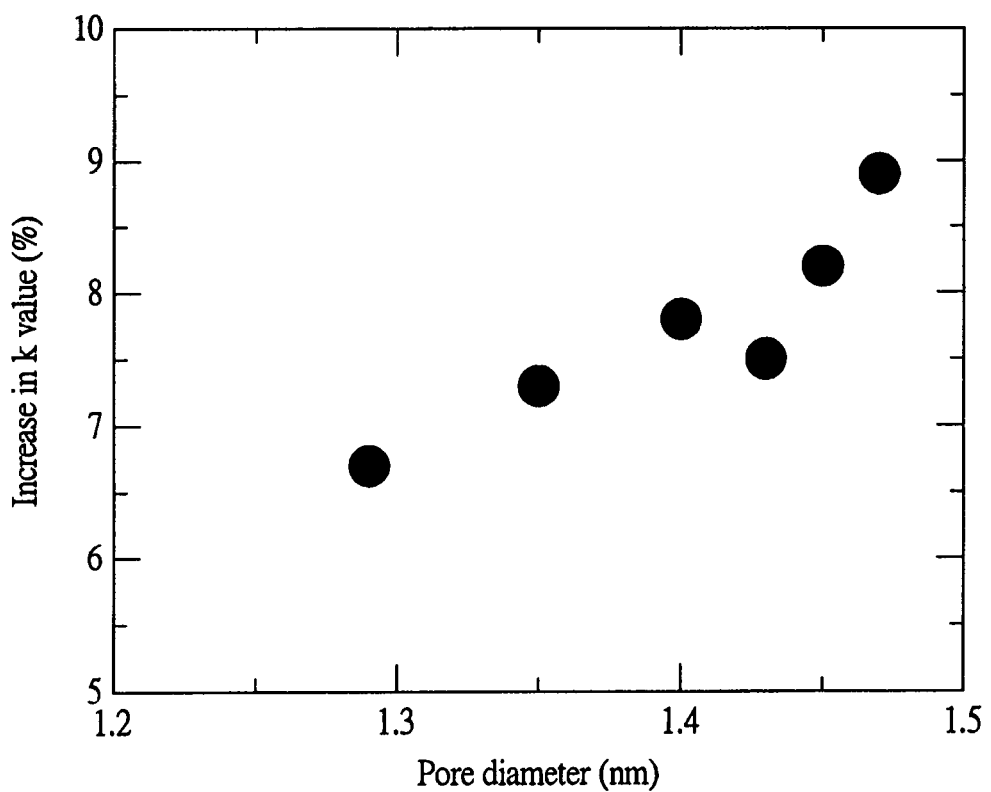
FIG. 5 is a graph showing the rate of increase in relative dielectric constant of the interlayer insulation film with respect to the mean diameter of pores.

FIG. 5 is a graph with the abscissa indicating the mean diameter of pores in the porous Low-k film, and the ordinate indicating the rate of increase in relative dielectric constant k of the porous Low-k film increased by damaging of the porous Low-k film due to the foregoing process. The graph indicates that a change in mean diameter of pores changes the damage resistance of the resulting porous Low-k film. In other words, the degree of the damage resistance of the porous Low-k film is evaluated with the rate of increase in relative dielectric constant as an index. FIG. 5 indicates the following: when the mean diameter of pores is 1.45 nm or more, particularly, the rate of increase in relative dielectric constant increases; this results in the formation of a porous Low-k film susceptible to process damages. Namely, FIG. 5 indicates the following: from the viewpoint of improving the damage resistance of the porous Low-k film, the mean diameter of pores is preferably less than 1.45 nm.

Figure 6:
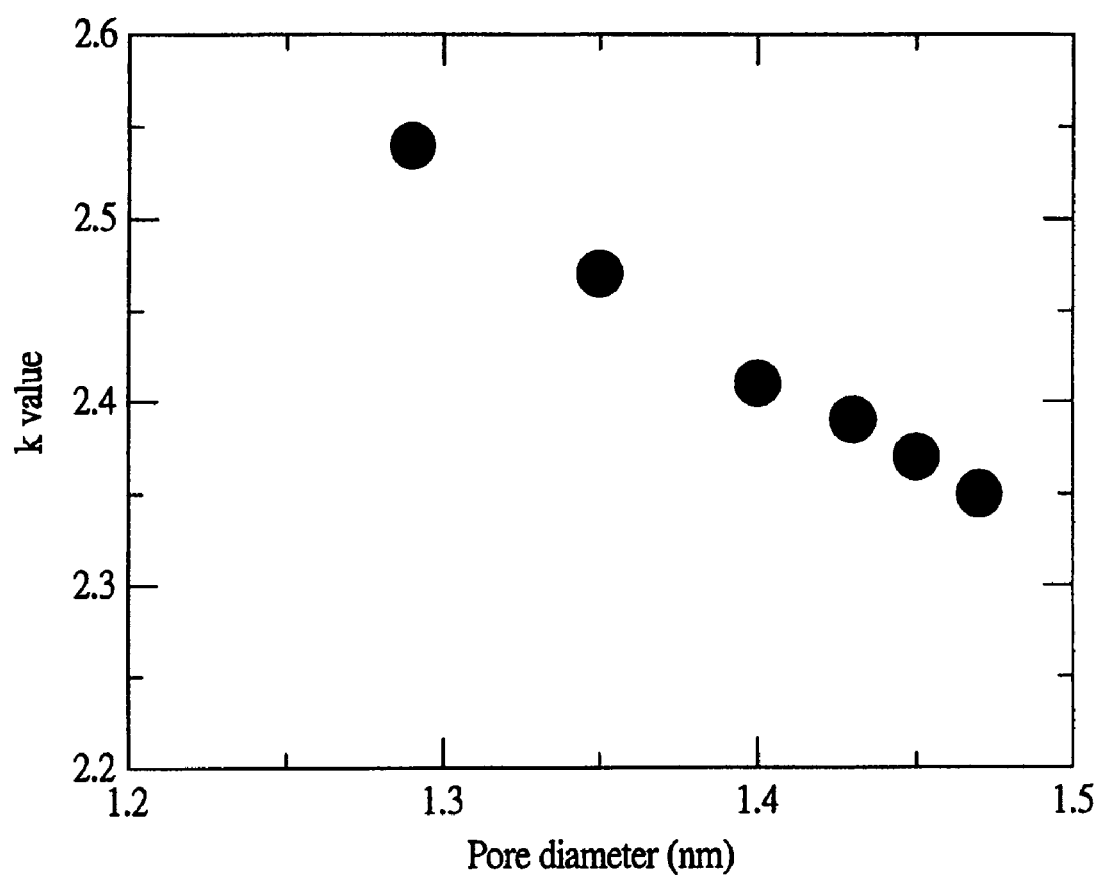
FIG. 6 is a graph showing the relative dielectric constant of the interlayer insulation film with respect to the mean diameter of pores.

FIG. 6 is a graph with the abscissa indicating the mean diameter of pores in the porous Low-k film, and the ordinate indicating the value of the relative dielectric constant k of the porous Low-k film. The graph indicates that a change in mean diameter of pores changes the relative dielectric constant of the resulting porous Low-k film. FIG. 6 indicates that with a decrease in mean diameter of pores, the relative dielectric constant increases. A porous Low-k film with a high relative dielectric constant causes wiring delay, and hence cannot be used as a porous Low-k film.

Incidentally, as indicated from the graph of FIG. 6, with a decrease in mean diameter of pores, the dielectric constant of the porous Low-k film linearly increases. When the mean diameter of pores is less than 1.0 nm, in the interlayer insulation film, the pores 10 shown in FIG. 3 are scarcely formed. Accordingly, the interlayer insulation film has a relative dielectric constant as high as that of the Low-k film having only the pores 11 as shown in FIG. 4. For this reason, the interlayer insulation film cannot be used for the interlayer insulation films IL2 to IL5 of the second fine layer shown in FIG. 1. Therefore, the mean diameter of pores in the porous Low-k film is required to be 1.0 nm or more.

Further, when the minimum interval (wiring pitch) between the plural second-layer wirings L2 shown in FIG. 1 is, for example, 90 nm or less with miniaturization of the semiconductor device, the relative dielectric constant of the interlayer insulation film IL2 formed between the plural second-layer wirings L2 is desirably 2.55 or less. Therefore, as shown in FIG. 6, when the mean diameter of pores in the porous Low-k film is less than 1.29 nm, the relative dielectric constant of the porous Low-k film becomes larger than 2.55. Thus, the porous Low-k film becomes unusable as the interlayer insulation film. For this reason, the mean diameter of pores in the whole porous Low-k film is in particular preferably 1.29 nm or more.

Therefore, in the present embodiment, by setting the mean diameter of pores at 1.0 nm or more and less than 1.45 nm, it becomes possible to suppress the increase in relative dielectric constant of the porous Low-k film due to process damages. Particularly, by setting the mean diameter of pores at 1.29 nm or more, it is possible to implement a porous Low-k film with a low relative dielectric constant, and to improve the electric characteristics of the interlayer insulation film.

Figure 7:
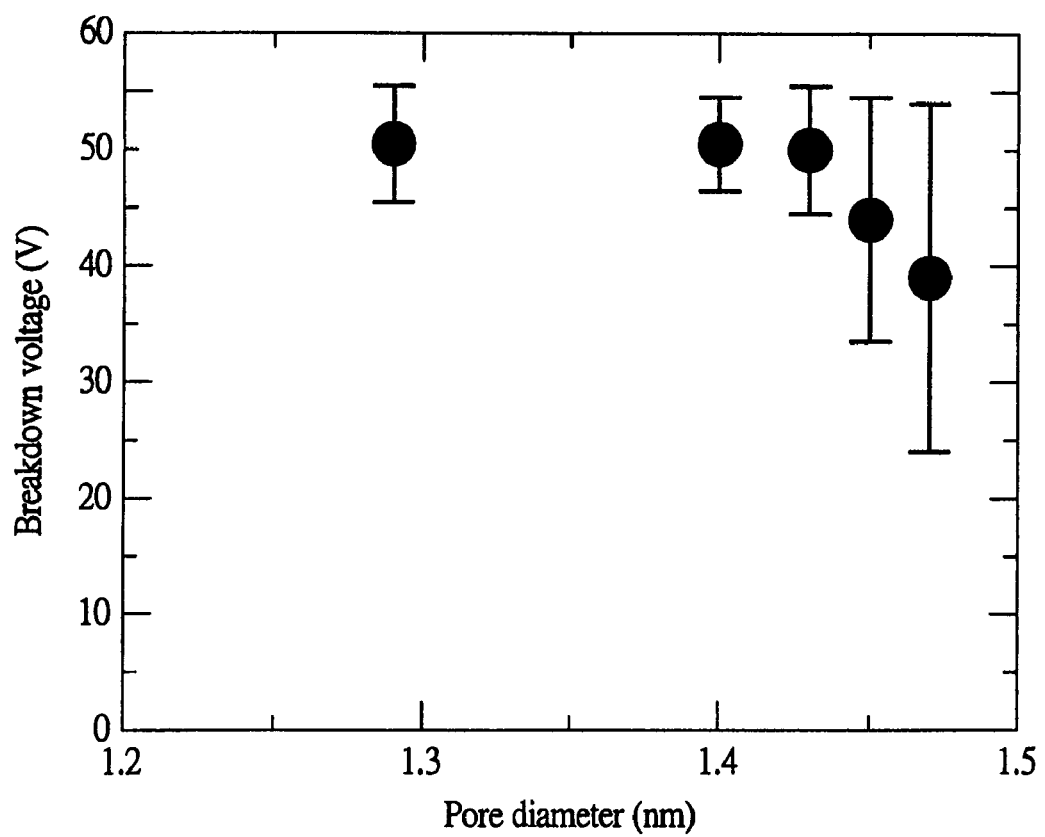
FIG. 7 is a graph showing the inter-wiring breakdown voltage of the interlayer insulation film with respect to the mean diameter of pores.

FIG. 7 is a graph with the abscissa indicating the mean diameter of pores in the porous Low-k film, and the ordinate indicating the breakdown voltage between wirings formed via the porous Low-k film. The graph indicates that a change in mean diameter of pores changes the inter-wiring breakdown voltage. Herein, from the viewpoint of preventing the reduction of the breakdown voltage between wirings, the following is required: the mean diameter of pores is suppressed, thereby to prevent the porous Low-k film from suffering process damages. As indicated in FIG. 7, when the mean diameter of pores is 1.45 nm or more, the inter-wiring breakdown voltage sharply decreases. This is for the following reason: as described by reference to FIGS. 41 and 42, in the porous Low-k film containing pores having a large mean diameter, the modified layer is formed from the surface to a deep region thereof; thus, in the interlayer insulation film, a moisture-containing region is formed, so that metal ions diffuse from the insides of the wirings into the interlayer insulation film. By setting the mean diameter of pores at less than 1.45 nm, it is possible to improve the breakdown voltage between wirings, and to improve the electric characteristics of the interlayer insulation film.

Figure 8:
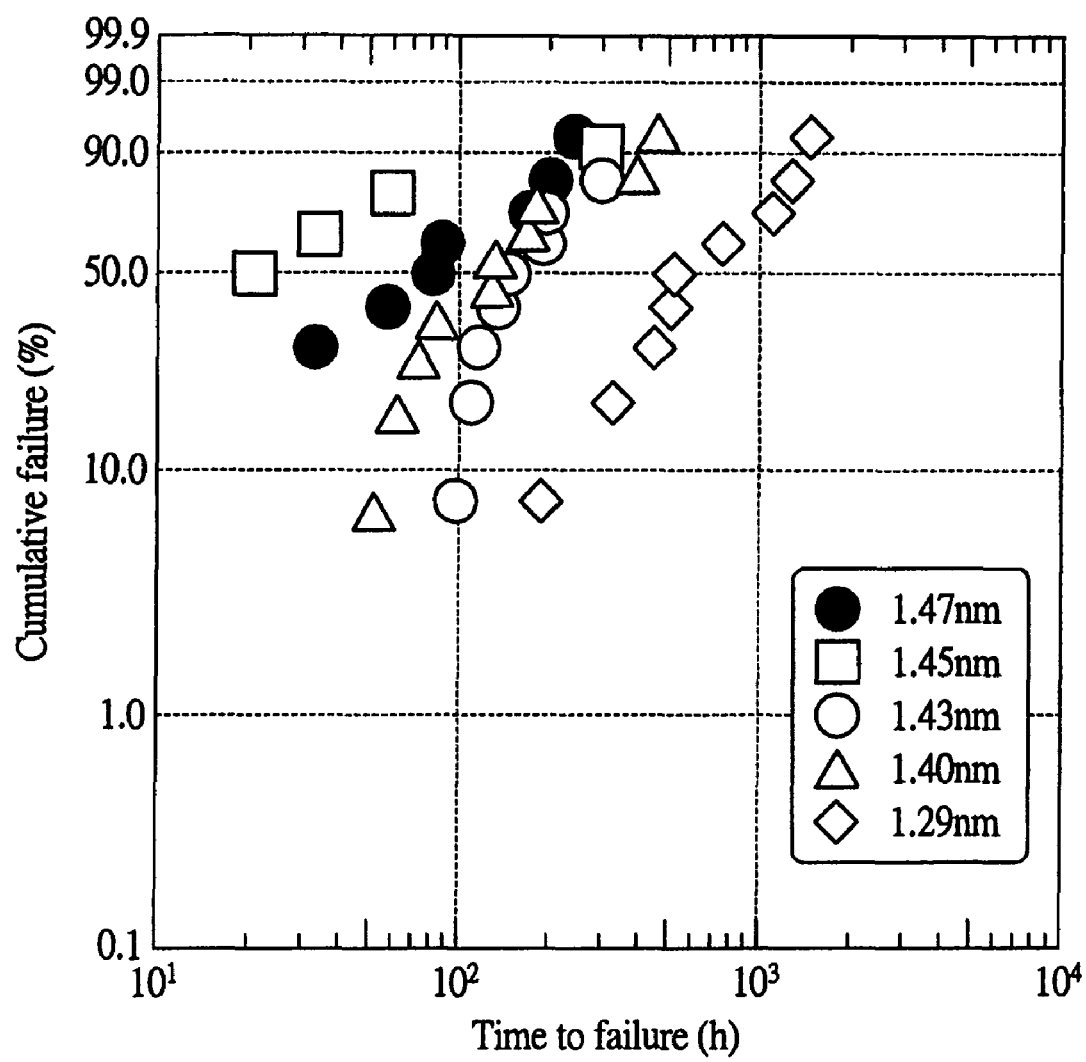
FIG. 8 is a graph showing the relationship between the inter-wiring TDDB lifetime and the cumulative distribution with respect to the mean diameter of pores.
Figure 9:
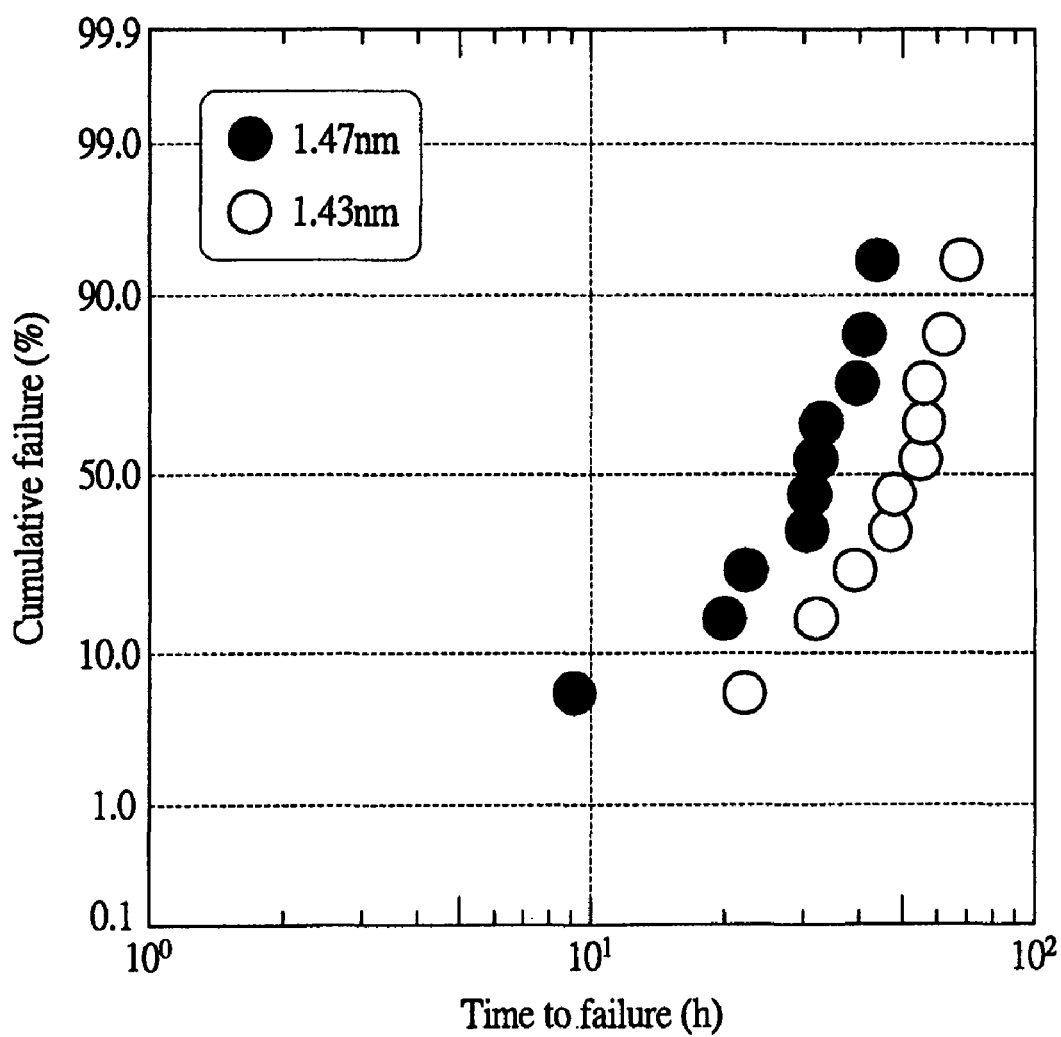
FIG. 9 is a graph showing the relationship between the wiring EM lifetime and the cumulative distribution with respect to the mean diameter of pores.

FIGS. 8 and 9 are graphs with the abscissas indicating the time of the inter-wiring TDDB lifetime and the time of the wiring EM lifetime, respectively, and the ordinates indicating the cumulative distribution. The graphs indicate that a change in mean diameter of pores in the porous Low-k film changes the inter-wiring TDDB lifetime and the wiring EM lifetime of the resulting porous Low-k film.

FIG. 8 indicates the following: when the mean diameter of pores is 1.45 nm or more, plots in the graph are distributed in a straight line having a gradient closer to that in the direction along abscissa than along the ordinate. Namely, when the mean diameter of pores is 1.45 nm or more, the possibility increases that the dielectric breakdown between wirings may occur in a short time. Conversely, in the graph shown in FIG. 8, when the mean diameter of pores is less than 1.45 nm, plots in the graph are distributed in a straight line having a gradient close to that in the direction along the ordinate. As a result, the possibility decreases that the inter-wiring TDDB lifetime may be shortened. From the viewpoint of preventing the shortening of the inter-wiring TDDB lifetime, the plots in the graph preferably have a gradient close to that in such a direction as to be along the ordinate. For this reason, the mean diameter of pores in the porous Low-k film is preferably less than 1.45 nm. Therefore, by setting the mean diameter of pores at less than 1.45 nm, and improving the inter-wiring TDDB lifetime, it is possible to improve the reliability of the interlayer insulation film.

FIG. 9 indicates the following: in the case where the mean diameter of pores is smaller than 1.45 nm, the wiring EM lifetime is longer than in the case where the mean diameter of pores is larger than 1.45 nm. From the viewpoint of preventing the shortening of the wiring EM lifetime, the mean diameter of pores is preferably set at less than 1.45 nm. Therefore, by setting the mean diameter of pores at less than 1.45 nm, and improving the wiring EM lifetime, it is possible to improve the reliability of the interlayer insulation film.

From the graphs of FIGS. 5 to 9 shown up to this point, in the present embodiment, the mean diameter of pores in the porous Low-k film (the interlayer insulation film of the second fine layer) is set at 1.0 nm or more and less than 1.45 nm, and preferably at 1.29 nm or more and less than 1.45 nm. As a result, it is possible to form an interlayer insulation film with a high damage resistance to process damages, long inter-wiring TDDB lifetime and wiring EM lifetime, and a low relative dielectric constant.

Figure 18:
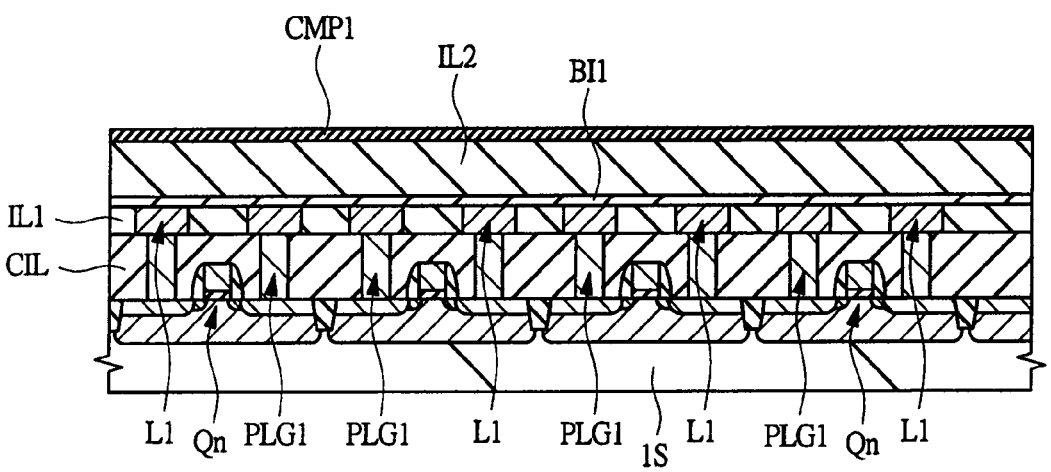
FIG. 18 is a cross-sectional view showing a method for manufacturing the semiconductor device following FIG. 17.
Figure 19:
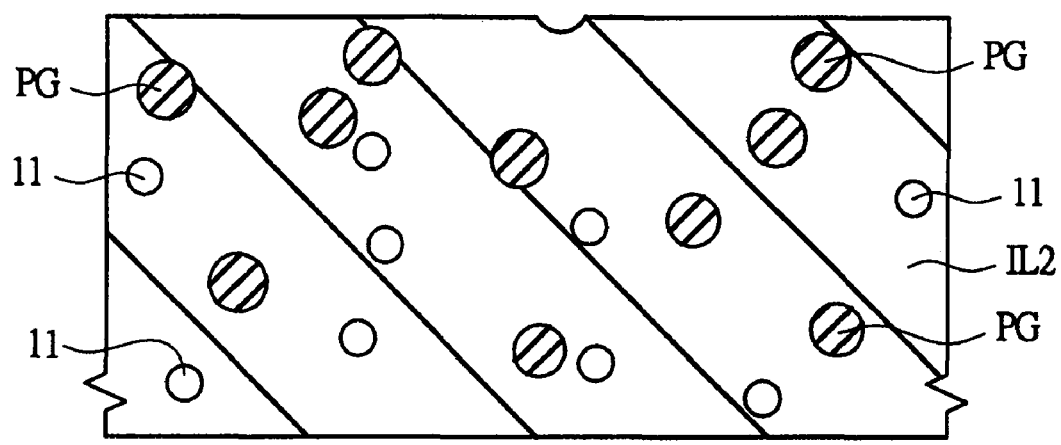
FIG. 19 is a cross-sectional view showing a part of the semiconductor device during the manufacturing step shown in FIG. 18 on an enlarged scale.
Figure 20:
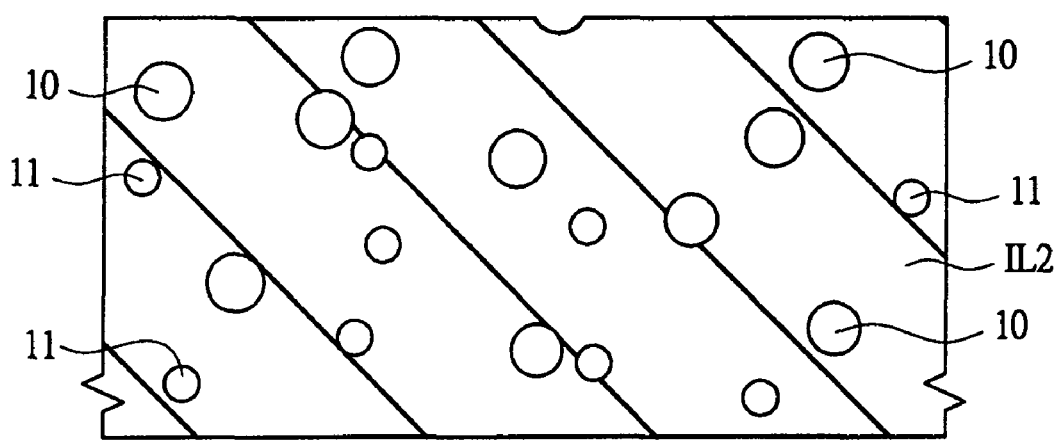
FIG. 20 is a cross-sectional view showing a method for manufacturing the semiconductor device following FIG. 19.

Then, a method for manufacturing the semiconductor device of the present embodiment for implementing pores having the foregoing mean diameter will be described by reference to FIGS. 10 to 40. FIGS. 10 to 18 and 21 to 40 are each a cross-sectional view showing the method for manufacturing the semiconductor device of the present embodiment including MISFETs Qn. FIGS. 19 and 20 are cross-sectional views showing the formation steps of the insulation film formed at the same layer as the second-layer wirings. Incidentally, the present invention is the invention relating to the interlayer insulation film adjacent to the metal wirings. Therefore, herein, a detailed description on the steps for forming the MISFETs is omitted.

Figure 10:
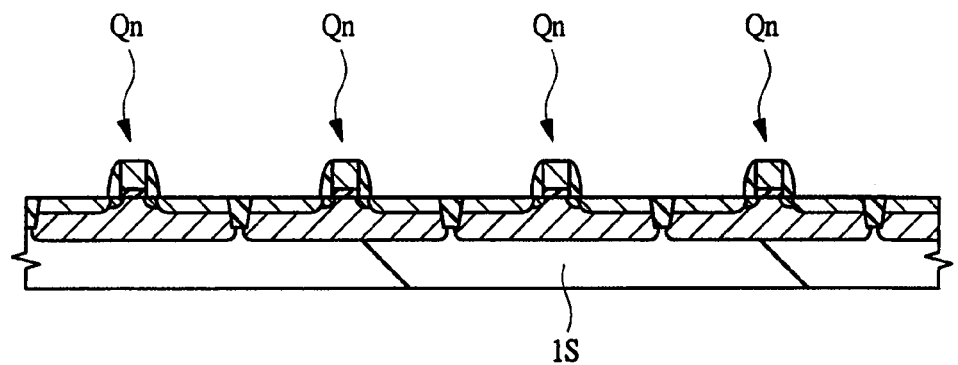
FIG. 10 is a cross-sectional view showing a method for manufacturing a semiconductor device which is one embodiment of the present invention.
Figure 11:
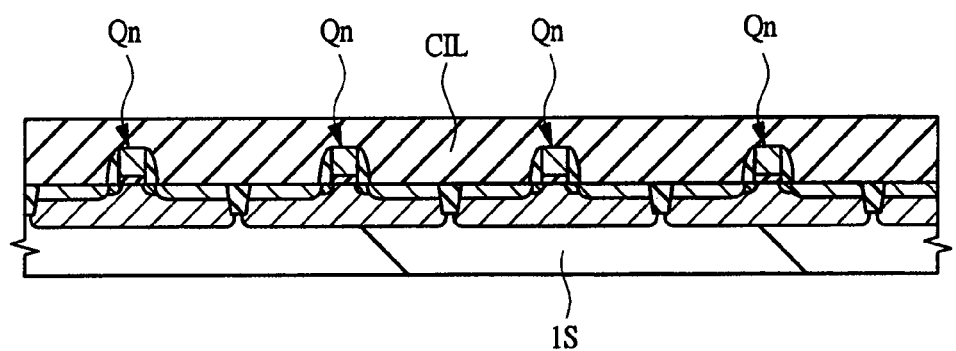
FIG. 11 is a cross-sectional view showing a method for manufacturing the semiconductor device following FIG. 10.

First, by using a general semiconductor manufacturing technology, as shown in FIG. 10, over the semiconductor substrate 1S, a plurality of MISFETs Qn are formed. Subsequently, as shown in FIG. 11, over the semiconductor substrate 1S including the plural MISFETs Qn formed thereover, the contact interlayer insulation film CIL is formed. The contact interlayer insulation film CIL is formed in such a manner as to cover the plural MISFETs Qn. Specifically, the contact interlayer insulation film CIL is formed of, for example, a lamination film of an ozone TEOS film formed with a thermal CVD method using ozone and TEOS as raw materials, and a plasma TEOS film disposed over the ozone TEOS film, and formed with a plasma CVD method using TEOS as a raw material. Incidentally, as a layer underlying the ozone TEOS film, there may be formed, for example, an etching stopper film including a silicon nitride film.

Figure 12:
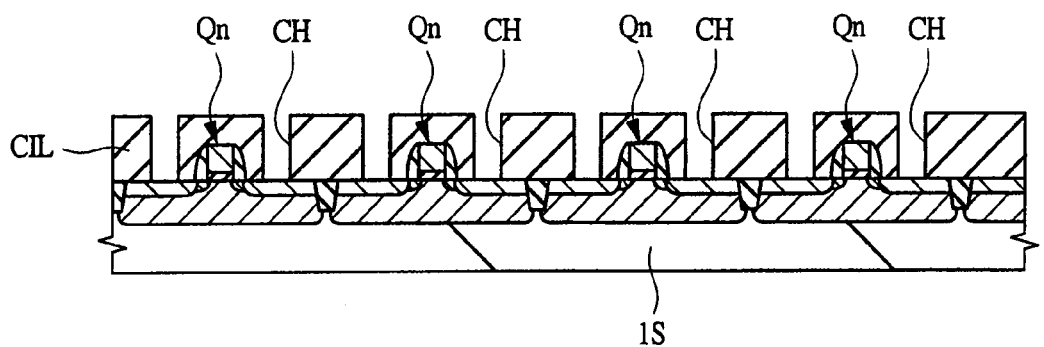
FIG. 12 is a cross-sectional view showing a method for manufacturing the semiconductor device following FIG. 11.

Then, as shown in FIG. 12, by using a photolithography technology and an etching technology, in the contact interlayer insulation film CIL, the contact holes CH are formed. The contact holes CH are processed in such a manner as to penetrate through the contact interlayer insulation film CIL, and to reach the source regions or the drain regions of the MISFETs Qn formed over the semiconductor substrate 1S.

Figure 13:
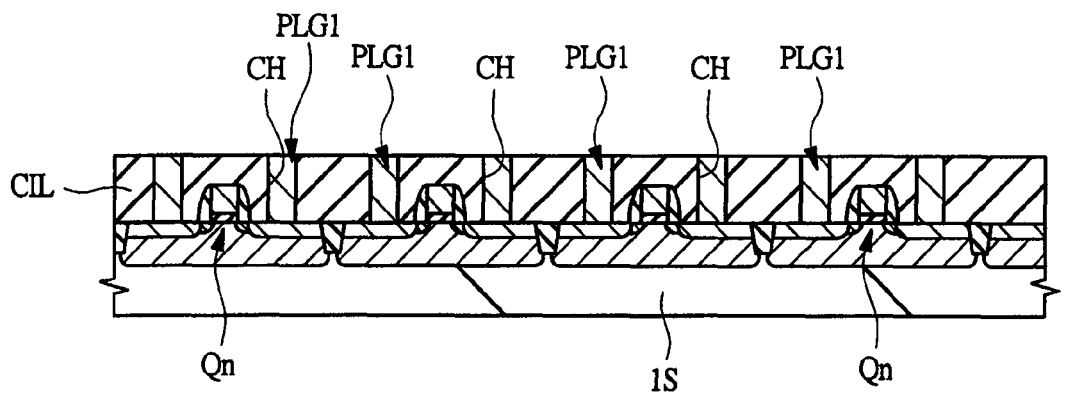
FIG. 13 is a cross-sectional view showing a method for manufacturing the semiconductor device following FIG. 12.

Subsequently, as shown in FIG. 13, in the contact holes CH formed in the contact interlayer insulation film CIL, a metal film is embedded, thereby to form plugs PLG1. Specifically, over the contact interlayer insulation film CIL including the contact holes CH formed therein, using, for example, a sputtering method, a titanium/titanium nitride film to be a barrier conductor film is formed. Then, over the titanium/titanium nitride film, a tungsten film is formed. As a result, over the inner walls (the sidewalls and the bottom surfaces) of the contact holes CH, a titanium/titanium nitride film is formed. Over the titanium/titanium nitride film, a tungsten film is formed in such a manner as to fill the contact holes CH. Then, unnecessary portions of the titanium/titanium nitride film and the tungsten film formed over the contact interlayer insulation film CIL are removed by a CMP method. As a result, only in the contact holes CH, the plugs PLG1 including the titanium/titanium nitride film and the tungsten film embedded therein can be formed, respectively.

Figure 14:
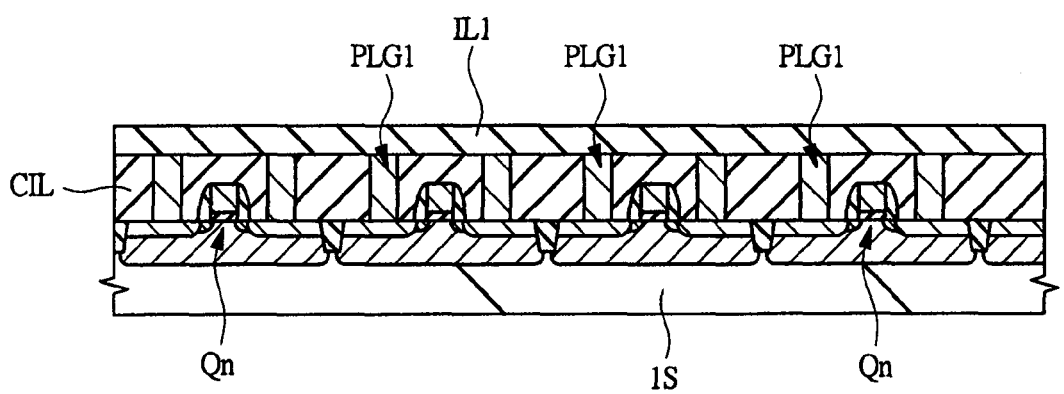
FIG. 14 is a cross-sectional view showing a method for manufacturing the semiconductor device following FIG. 11.

Then, as shown in FIG. 14, over the contact interlayer insulation film CIL including the plugs PLG1 formed therein, the interlayer insulation film IL1 is formed. The interlayer insulation film IL1 is formed of, for example, a SiOC film of a Low-k film with a lower relative dielectric constant than that of the passivation film PAS shown in FIG. 1, and is formed by using, for example, a plasma CVD method.

Figure 15:
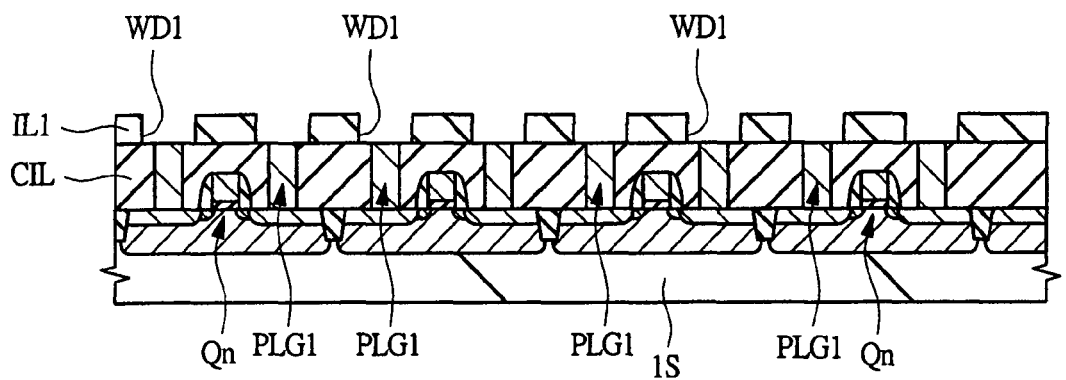
FIG. 15 is a cross-sectional view showing a method for manufacturing the semiconductor device following FIG. 14.

Then, as shown in FIG. 15, using a photolithography technology and an etching technology, in the interlayer insulation film IL1, wiring grooves WD1 are formed. The wiring grooves WD1 are formed in such a manner as to penetrate through the interlayer insulation film IL1 including a SiOC film, and to reach the contact interlayer insulation film CIL at the bottom surfaces thereof. As a result, at the bottoms of the wiring grooves WD1, the surfaces of the plugs PLG1 are exposed, respectively.

Figure 16:
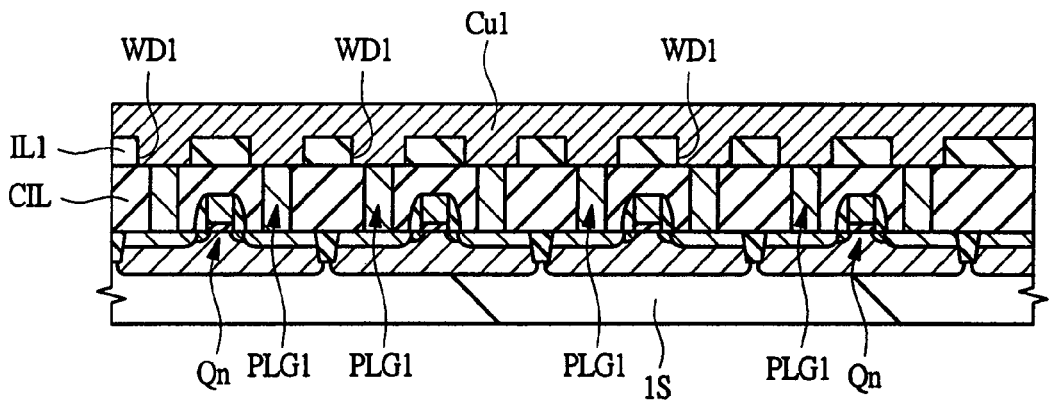
FIG. 16 is a cross-sectional view showing a method for manufacturing the semiconductor device following FIG. 15.

Then, as shown in FIG. 16, over the interlayer insulation film IL1 including the wiring grooves WD1 formed therein, a barrier conductor film (copper diffusion preventive film) (not shown) is formed. The barrier film corresponds to the barrier conductor film BM1 shown in FIG. 2. Specifically, the barrier conductor film includes tantalum (Ta), titanium (Ti), ruthenium (Ru), tungsten (W), manganese (Mn) and a nitride or a nitride silicide thereof, or a lamination film thereof, and is formed by using, for example, a sputtering method.

Subsequently, over the barrier conductor film formed over the insides of the wiring grooves WD1, and the interlayer insulation film IL1, a seed film including, for example, a thin copper film is formed with a sputtering method. Then, by an electrolytic plating method with the seed film as an electrode, a copper film Cu1 is formed. The copper film Cu1 is formed in such a manner as to fill the wiring grooves WD1. The copper film Cu1 is formed of a film mainly including, for example, copper. Specifically, the copper film Cu1 is formed of copper (Cu) or a copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid series metal, or actinoid series metal). Alternatively, it is also acceptable that metal wirings mainly including silver or gold are formed in place of the copper film. Cu1. Incidentally, herein, the copper film Cu1 is formed using an electrolytic plating method. However, it is also acceptable that the copper film Cu1 is formed using a CVD method.

Figure 17:
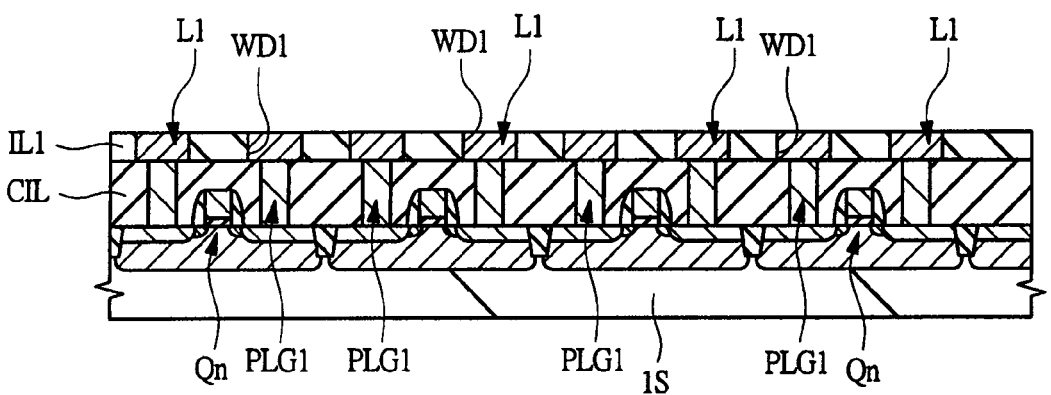
FIG. 17 is a cross-sectional view showing a method for manufacturing the semiconductor device following FIG. 16.

Then, as shown in FIG. 17, unnecessary portions of the barrier conductor film and the copper film Cu1 formed over the interlayer insulation film IL1 are removed by a CMP method. As a result, it is possible to form a layer (first fine layer) including the first-layer wirings L1 in each of which the barrier conductor film and the copper film Cu1 are embedded in the wiring groove WD1.

Then, on the surface of the interlayer insulation film IL1 including the first-layer wirings L1 formed therein, an ammonia plasma treatment is carried out. As a result, the surfaces of the first-layer wirings L1 and the surface of the interlayer insulation film IL1 are cleaned. Subsequently, as shown in FIG. 18, over the interlayer insulation film IL1 including the first-layer wirings L1 formed therein, a barrier insulation film BI1 is formed. The barrier insulation film BI1 includes, for example, a lamination film of a SiCN film and a SiOC film. For example, the lamination film can be formed with a CVD method. Incidentally, in the present embodiment, on the surface of the interlayer insulation film IL1 including the first-layer wirings L1 formed therein, a cleaning treatment by an ammonia plasma treatment is carried out. Then, the barrier insulation film BI1 is formed. This results in an improvement of the adhesion between the interlayer insulation film IL1 and the barrier insulation film BI1.

Then, over the barrier insulation film BI1, the interlayer insulation film IL2 is formed. Further, over the interlayer insulation film IL2, a CMP protective film CMP1 is formed. Specifically, the interlayer insulation film IL2 is formed of a porous SiOC film having a plurality of pores formed using porogen described later. Therefore, the interlayer insulation film IL2 is an insulation film having a lower relative dielectric constant than that of, for example, the Low-k film forming the interlayer insulation film IL1. The SiOC film having pores can be formed using, for example, a plasma CVD method. Whereas, the CMP protective film CMP1 includes, for example, a TEOS film or a silicon oxide film.

Herein, by reference to FIGS. 19 and 20, a detailed description will be given to the method for forming the interlayer insulation film IL2. The interlayer insulation film IL2 is formed by depositing a SiOC film in a plasma CVD device. The SiOC film is a porous Low-k film having a plurality of pores in the inside thereof, and can be formed in the following manner. An insulation film containing porogen is formed by a plasma CVD method. Then, the porogen is eliminated from the insulation film.

Incidentally, the porogen is a pore forming agent for forming a large number of pores in the interlayer insulation film IL2 shown in FIG. 18. The insulation film having a plurality of pores containing a porogen gas therein is formed. Then, a curing step of eliminating (exhausting) the porogen from the inside of the insulation film is performed. As a result, a plurality of pores not containing porogen are formed, thereby to form the interlayer insulation film IL2.

As the deposition conditions when the diameter of the semiconductor substrate (semiconductor wafer) is set at 200 mm are set as follows: the RF power for plasma excitation is set at 200 to 600 W; the pressure in the plasma CVD device, 600 to 1000 Pa; and the temperature of the semiconductor substrate 1S, 100 to 300° C. Under the conditions, into the plasma CVD device, $O_2$ (oxygen), He (helium), $C_5H_{14}O_2Si$ (methyldiethoxysilane), and porogen which are raw-material gases for forming the porogen-containing interlayer insulation film IL2 (see FIG. 12) are supplied, thereby to deposit the interlayer insulation film IL2. Herein, $O_2$ (oxygen) is supplied in an amount of 0 to 50 sccm (standard cc/min); He (helium), in an amount of 0 to 5000 sccm; $C_5H_{14}O_2Si$ (methyldiethoxysilane), in an amount of 0.2 g/min; and porogen, in an amount of 0.05 to 0.08 g/min. Incidentally, the term "sccm" which is the unit indicating the flow rate of oxygen and helium denotes the volume of a substance flowing per hour under the conditions of 1 atmospheric pressure and 0° C.

Specifically, in the present embodiment, the RF power for plasma excitation is set at 380 W; the pressure in the plasma CVD device, 800 Pa; and the temperature of the semiconductor substrate 1S, 250° C. Then, into the plasma CVD device, $O_2$ (oxygen) is supplied in an amount of 12 sccm (standard cc/min); He (helium), in an amount of 470 sccm; $C_5H_{14}O_2Si$ (methyldiethoxysilane), in an amount of 0.2 g/min; and porogen, in an amount of 0.08 g/min.

Incidentally, of the gases supplied into the CVD device, those serving as the main raw materials forming the porogen-containing interlayer insulation film IL2 are methyldiethoxysilane and porogen. However, oxygen is also a raw-material gas forming the porogen-containing interlayer insulation film IL2. Helium is supplied for generating a plasma. However, herein, all the gases including helium to be supplied to the plasma CVD device are defined as raw-material gases. The flow rate of oxygen of 12 sccm can be converted into about 0.017 g/min. Whereas, the flow rate of helium of 470 sccm can be converted into about 0.042 g/min.

In the present embodiment, the flow rate of porogen in the deposition step is set at a flow rate of 20% or more and less than 30% of the total flow rate of oxygen, helium, porogen, and methyldiethoxysilane of the raw-material gases. In the case of the specific conditions, the total flow rate of the raw-material gases is 0.34 g/min. The flow rate of porogen thereof is 0.08 g/min. Accordingly, the flow rate of porogen is about 23.5% of the total flow rate of the raw-material gases.

As the materials for porogen, there can be used $C_XH_Y$ (hydrocarbon) with a molecular weight of 80 or more and 150 or less such as α-terpinen ($C_{10}H_{16}$), limonene ($C_{10}H_{16}$), or cyclooctane. Further, as the curing step of eliminating porogen from the interlayer insulation film IL2, there is the curing step by UV (Ultraviolet) irradiation, EB (Electron Beam) irradiation, a heat treatment using a lamp or the like, a plasma, or the like. Incidentally, the term "curing" herein used means the step of applying an energy to the porogen in the interlayer insulation film by the UV irradiation, EB irradiation, or the like, and exhausting the porogen out of the interlayer insulation film. Further, the curing step also has a role of enhancing the strength of the interlayer insulation film IL2.

Namely, as shown in FIG. 19, by the deposition step by the plasma CVD method, over the barrier conductor film BM1 (not shown), there is formed the interlayer insulation film IL2 including large numbers of pores filled with a gas of porogen PG, and the pores 11, respectively. Then, for example, an electron beam (EB) is applied toward the main surface of the semiconductor substrate 1S (not shown), thereby to exhaust the porogen PG from the interlayer insulation film IL2 (perform curing). As a result, as shown in FIG. 20, a plurality of pores containing porogen have become the pores 10 not containing porogen, so that the porous interlayer insulation film IL2 having the pores 10 and 11 can be formed.

Further, in the curing step described by reference to FIG. 20, porogen is extracted from the inside of the interlayer insulation film IL2 to the uppermost surface of the interlayer insulation film IL2. However, such voids as to extend along the path for porogen to be extracted are not continuously formed, but, as shown in FIG. 20, a plurality of voids are formed in such a manner as to scatter at the traces caused by elimination of porogen. For example, the mean diameter of the pores 10 formed under the foregoing conditions is 1.68 nm. The mean diameter of the pores 11 is 0.9 nm. In this case, the mean diameter of the pores 10 and the pores 11 is 1.29 nm. Therefore, the mean diameter of the pores 10 is a value of less than 1.7 nm described above. Whereas, the mean diameter of the pores 11 is a value within the range of 0.6 or more and less than 1.0 nm described above. Therefore, the mean diameter of the pores 10 and the pores 11 is a value within the range of 1.0 nm or more and less than 1.45 nm described above.

Subsequently, as shown in FIG. 21, over the CMP protective film CMP1, a photoresist film FR1 is formed. Then, the photoresist film FR1 is subjected to an exposure/development treatment, thereby to pattern the photoresist film FR1. Patterning is performed in such a manner as to open the regions for forming via holes therein. Then, with the patterned photoresist film FR1 as a mask, the CMP protective film CMP1 and the interlayer insulation film IL2 are etched. As a result, it is possible to form via holes V1 penetrating through the CMP protective film CMP1 and the interlayer insulation film IL2, and exposing the barrier insulation film BI1. Thus, the barrier insulation film BI1 functions as an etching stopper for etching.

Figure 22:
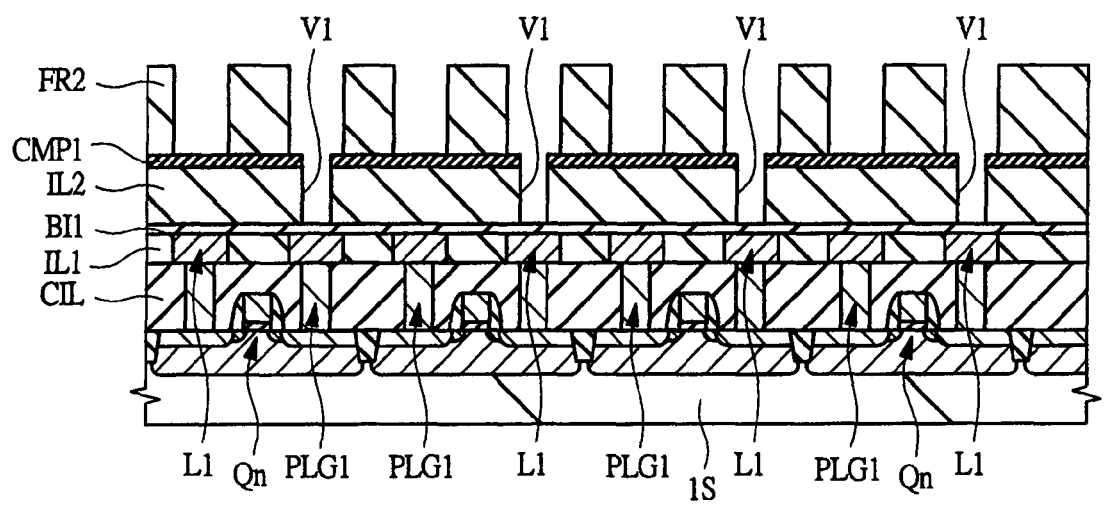
FIG. 22 is a cross-sectional view showing a method for manufacturing the semiconductor device following FIG. 21.

Then, as shown in FIG. 22, the patterned photoresist film FR1 is removed by a plasma ashing treatment. Then, the main surface of the semiconductor substrate 1S is cleaned. Then, over the CMP protective film CMP1, a photoresist film FR2 is formed. The photoresist film FR2 is subjected to an exposure/development treatment, thereby to pattern the photoresist film FR2. Patterning of the photoresist film FR2 is performed in such a manner as to open the regions for forming wiring grooves therein.

Then, as shown in FIG. 23, by anisotropic etching with the patterned photoresist film FR2 as a mask, the CMP protective film CMP1 is etched. Then, the patterned photoresist film FR2 is removed by a plasma ashing treatment. Then, the main surface of the semiconductor substrate 1S is cleaned.

Subsequently, as shown in FIG. 24, by an etching back method, portions of the barrier insulation film BI1 exposed at the bottoms of the via holes V1 are removed. As a result, at the bottoms of the via holes V1, the surfaces of the first-layer wirings L1 are exposed, respectively. By the etching back step at this time, portions of the interlayer insulation film IL2 exposed from the patterned CMP protective film CMP1 are also etched to form the wiring grooves WD2.

Figure 25:
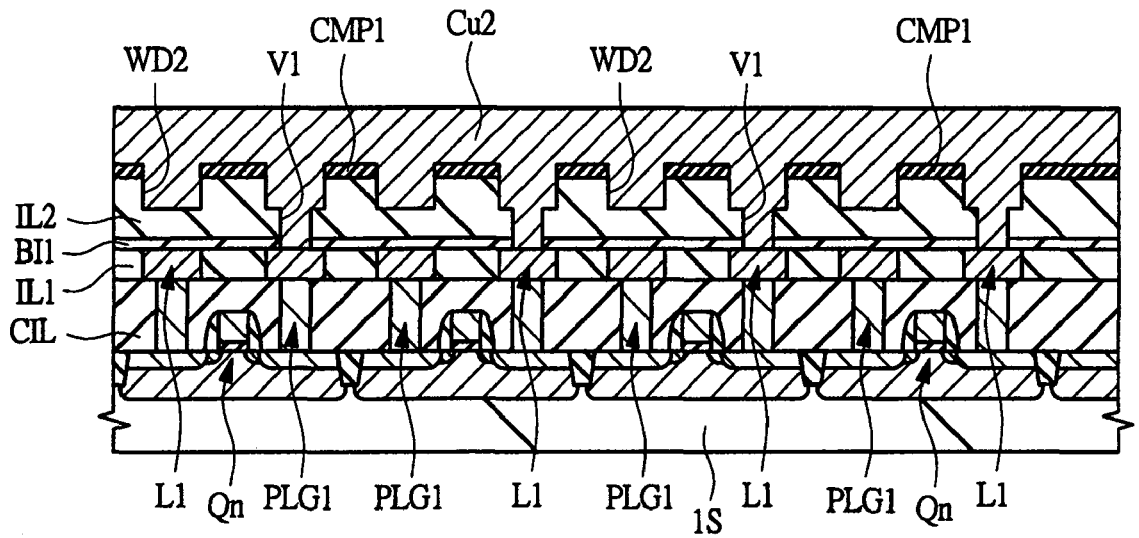
FIG. 25 is a cross-sectional view showing a method for manufacturing the semiconductor device following FIG. 24.

Then, as shown in FIG. 25, over the interlayer insulation film IL2 and the CMP protective film CMP1 including the wiring grooves WD2 and via holes V1 formed therein, a barrier conductor film BM2 (not shown) having the same structure as that of the barrier conductor film BM1 (see FIG. 2) is formed.

Subsequently, over the barrier conductor film formed in the insides of the wiring grooves WD2, and over the CMP protective film CMP1, a seed film including, for example, a thin copper film is formed with a sputtering method. Then, by an electrolytic plating method using the seed film as an electrode, a copper film Cu2 is formed. The copper film Cu2 is formed in such a manner as to fill the wiring grooves WD2. The copper film Cu2 is formed of a film mainly including, for example, copper.

Figure 26:
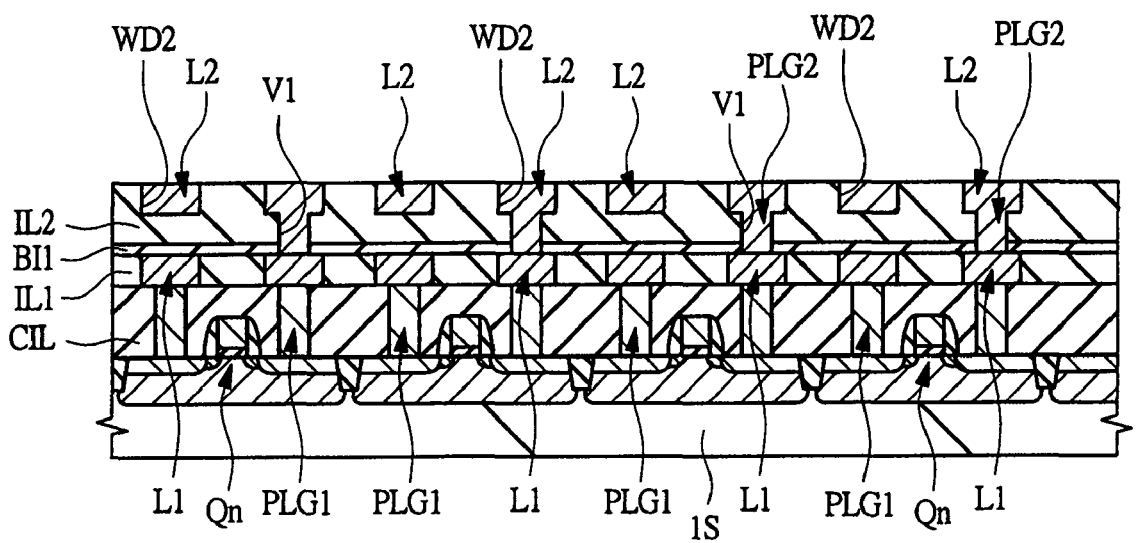
FIG. 26 is a cross-sectional view showing a method for manufacturing the semiconductor device following FIG. 25.

Subsequently, as shown in FIG. 26, unnecessary portions of the barrier conductor film and the copper film Cu2 formed over the CMP protective film CMP1 are removed with a CMP method. As a result, the interlayer insulation film IL2 is exposed. In addition, there can be formed the second-layer wirings L2 in which the barrier conductor film and the copper film Cu2 are embedded in the wiring grooves WD2, and the plugs PLG2 in which the barrier conductor film and the copper film Cu2 are embedded in the via holes V1. The CMP protective film CMP1 is disposed for protecting the semiconductor device during manufacturing steps from polishing pressure and scratch damages by the CMP method at this step.

Incidentally, in the present embodiment, as described by reference to FIGS. 21 to 26, in the step of forming the second-layer wirings L2 and the plugs PLG2, there is used a via-first manufacturing method in which in the interlayer insulation film IL2, the via holes V1 are formed, and then the wiring grooves WD2 are formed. However, it is also acceptable that there is used a trench-first manufacturing method in which in the interlayer insulation film IL2, the wiring grooves WD2 are formed, and then, the via holes V1 are formed.

Then, as shown in FIG. 27, on the surface of the interlayer insulation film IL2 including the second-layer wirings L2 formed therein, an ammonia plasma treatment is carried out, thereby to clean the surfaces of the second-layer wirings L2 and the surface of the interlayer insulation film IL2. Subsequently, over the interlayer insulation film IL2 including the second-layer wirings L2 formed therein, a barrier insulation film BI2 is formed. The barrier insulation film BI2 includes, for example, a lamination film of a SiCN film and a SiOC film. For example, the lamination film can be formed with a CVD method. By repeating such manufacturing steps, the third-layer wirings L3 to fifth-layer wirings L5 are formed. As a result, it is possible to form the second fine layer (second-layer wirings L2 to fifth-layer wirings L5). At this step, all the interlayer insulation films IL2 to IL5 are porous Low-k films having the pores 10 and 11 with a mean diameter of 1.0 nm or more and less than 1.45 nm as shown in FIG. 3.

Subsequently, a description will be given to the step of forming the semi-global layer over the second fine layer. As shown in FIG. 28, on the surface of the interlayer insulation film IL5 including the fifth-layer wirings L5 formed therein, an ammonia plasma treatment is carried, out, thereby to clean the surfaces of the fifth-layer wirings L5 and the surface of the interlayer insulation film IL5. Subsequently, over the interlayer insulation film IL5 including the fifth-layer wirings L5 formed therein, a barrier insulation film BI5 is formed. The barrier insulation film BI5 is formed of, for example, a lamination film of a SiCN film and a SiOC film. For example, the lamination film can be formed with a CVD method.

Then, over the barrier insulation film BI5, an interlayer insulation film IL6 is formed. The interlayer insulation film IL6 is formed of, for example, a SiOC film, and is formed using, for example, a plasma CVD method. The interlayer insulation film IL6 is a Low-k film shown in FIG. 4. In the interlayer insulation film IL6, the pores 11 are formed, but the pores 10 (see FIG. 3) are not formed.

Figure 29:
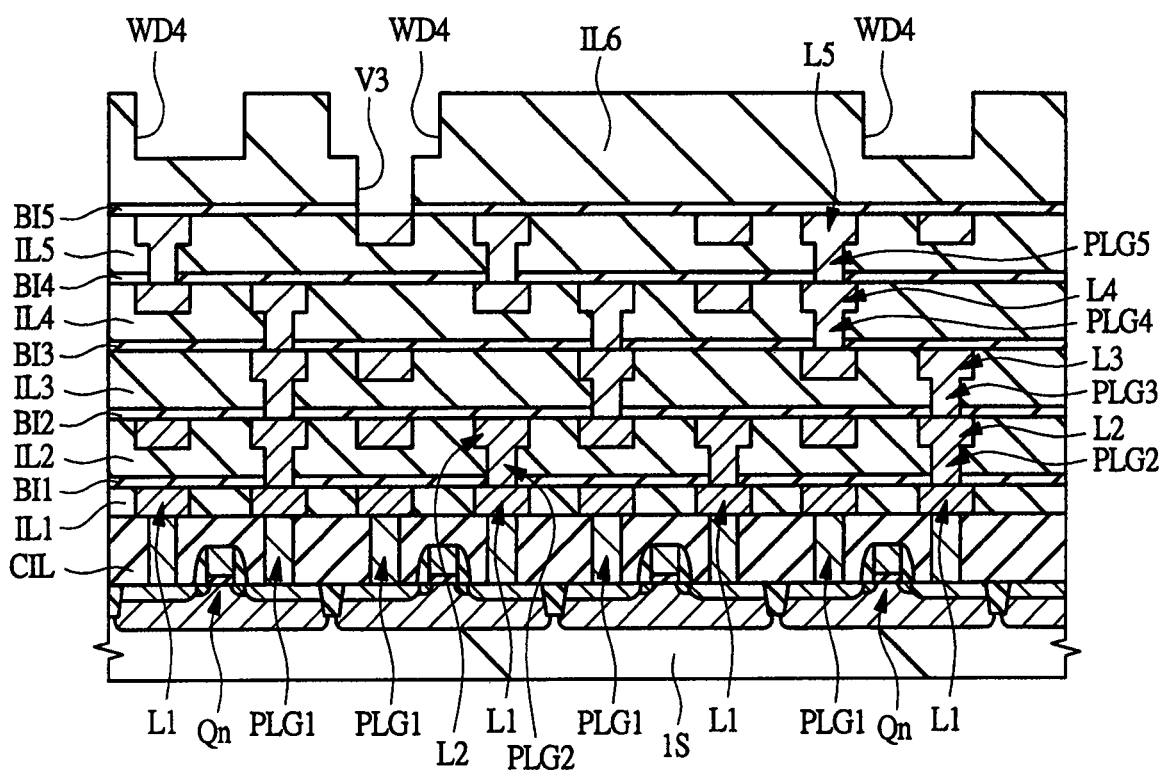
FIG. 29 is a cross-sectional view showing a method for manufacturing the semiconductor device following FIG. 28.

Then, as shown in FIG. 29, by using a photolithography technology and an etching technology, in the interlayer insulation film IL6, wiring grooves WD4 and via holes V3 are formed. The via holes V3 are formed in such a manner as to penetrate through the interlayer insulation film IL6 including a SiOC film, and to reach the fifth-layer wirings L5 at the bottom surfaces thereof. As a result, at the bottoms of the via holes V3, the surfaces of the fifth-layer wirings L5 are exposed.

Figure 30:
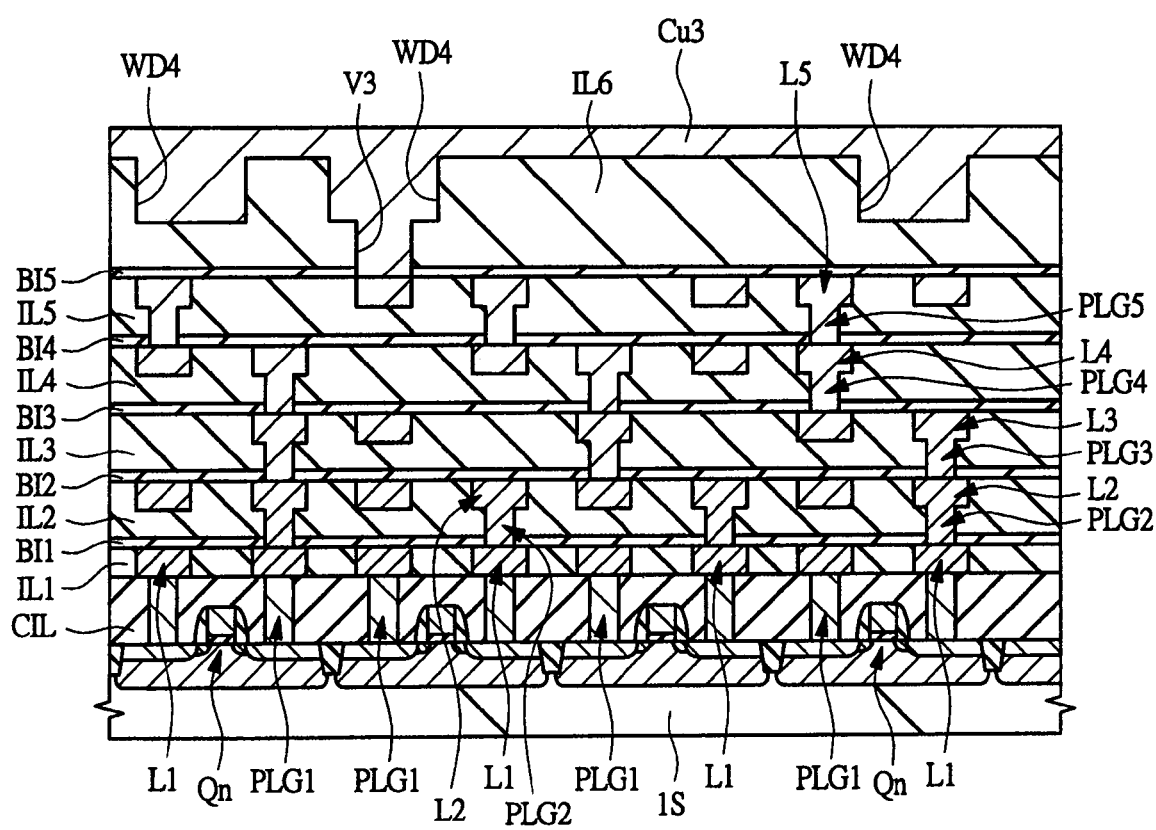
FIG. 30 is a cross-sectional view showing a method for manufacturing the semiconductor device following FIG. 29.

Then, as shown in FIG. 30, over the interlayer insulation film IL6 including the wiring grooves WD4 and the via holes V3 formed therein, the barrier conductor film (copper diffusion preventive film) (not shown) is formed. Specifically, the barrier conductor film includes tantalum (Ta), titanium (Ti), ruthenium (Ru), tungsten (W), manganese (Mn) and a nitride or a nitride silicide thereof, or a lamination film thereof, and is formed by using, for example, a sputtering method.

Subsequently, over the barrier conductor film formed in the insides of the wiring grooves WD4 and the via holes V3, and over the interlayer insulation film IL6, a seed film including, for example, a thin copper film is formed by a sputtering method. Then, by an electrolytic plating method with the seed film as an electrode, a copper film Cu3 is formed. The copper film Cu3 is formed in such a manner as to fill the wiring grooves WD4 and the via holes V3. The copper film Cu3 is formed of a film mainly including, for example, copper. Specifically, the copper film Cu3 is formed of copper (Cu) or a copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid series metal, or actinoid series metal).

Figure 31:
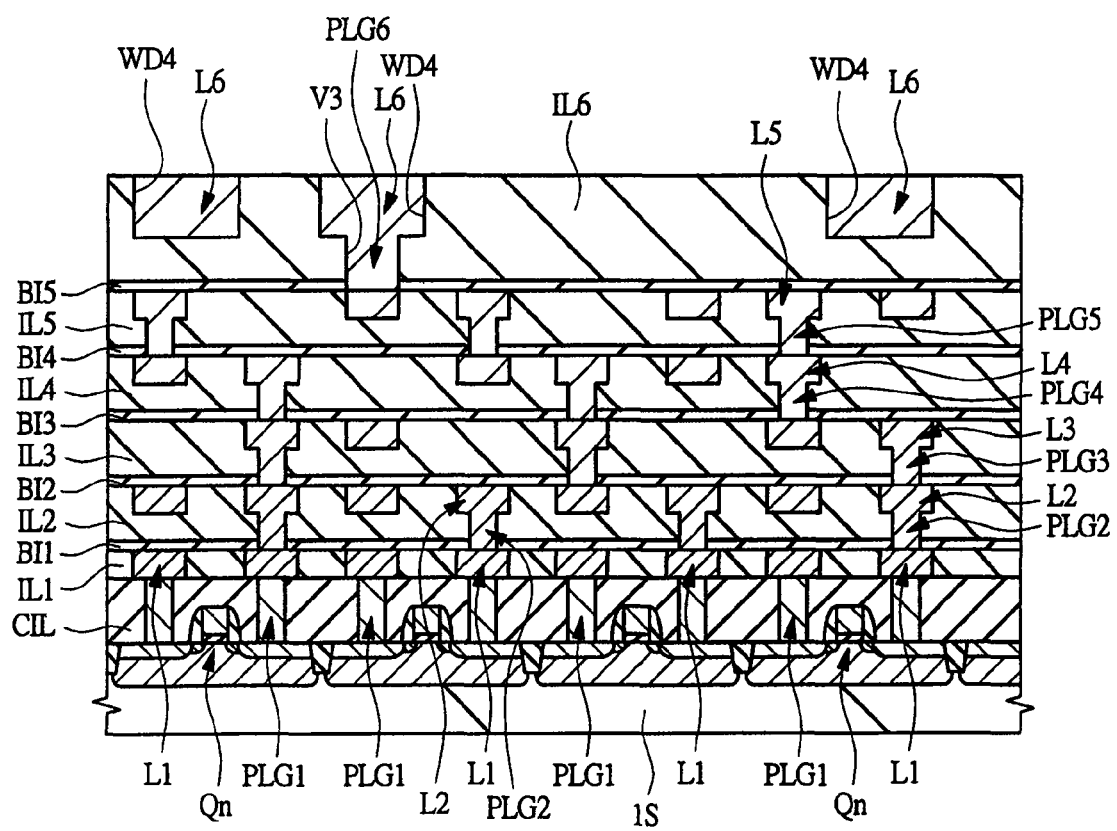
FIG. 31 is a cross-sectional view showing a method for manufacturing the semiconductor device following FIG. 30.
Figure 32:
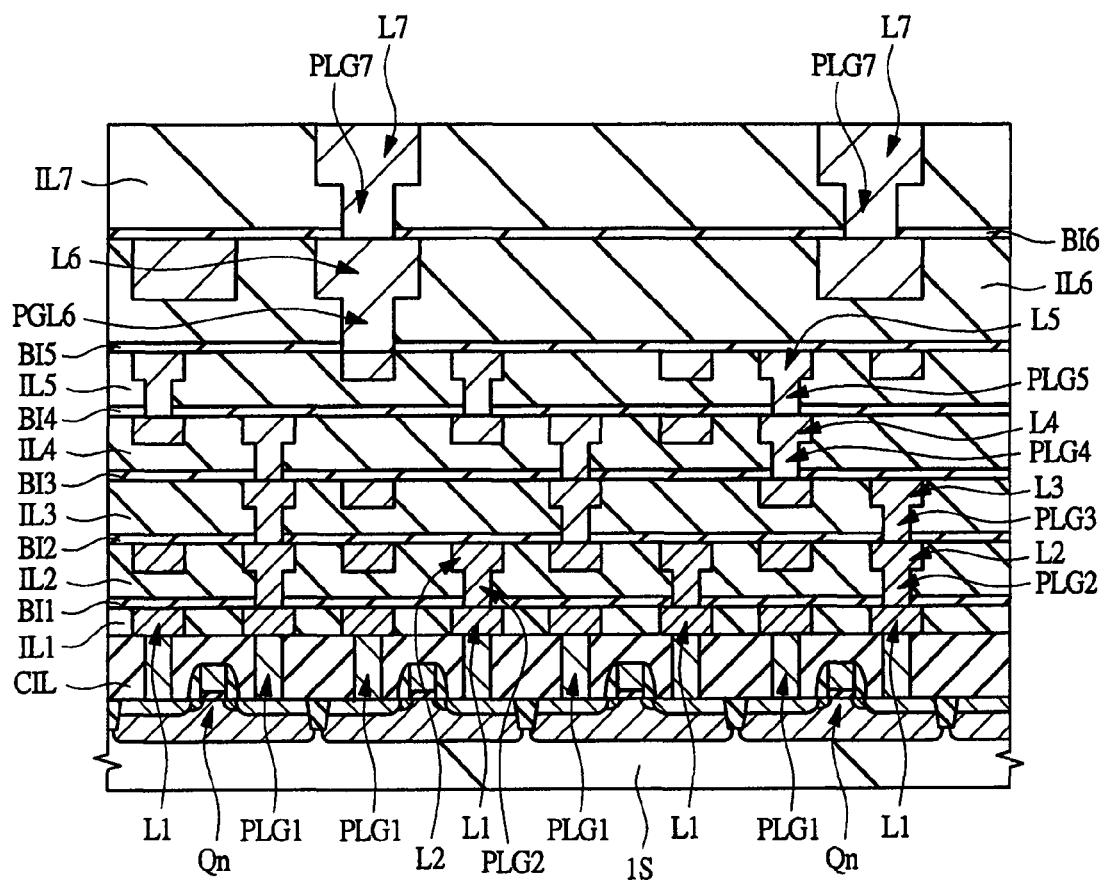
FIG. 32 is a cross-sectional view showing a method for manufacturing the semiconductor device following FIG. 31.

Then, as shown in FIG. 31, unnecessary portions of the barrier conductor film and the copper film Cu3 formed over the interlayer insulation film IL6 are removed by a CMP method. As a result, there can be formed the sixth-layer wirings L6 in which the barrier conductor film and the copper film Cu3 are embedded in the wiring grooves WD4, and the plugs 6 in which the barrier conductor film and the copper film Cu3 are embedded in the via holes V3. In the foregoing manner, the sixth-layer wirings L6 can be formed. By repeating such manufacturing steps, the seventh-layer wirings L7 as shown in FIG. 32 are also formed. As a result, it is possible to form the semi-global layer (the sixth-layer wirings L6 and the seventh-layer wirings L7). The interlayer insulation film IL6 has the same structure as that of the interlayer insulation film IL6 shown in FIG. 4. In the interlayer insulation film IL7, the pores 11 are formed, but the pores 10 (see FIG. 3) are not formed.

Figure 33:
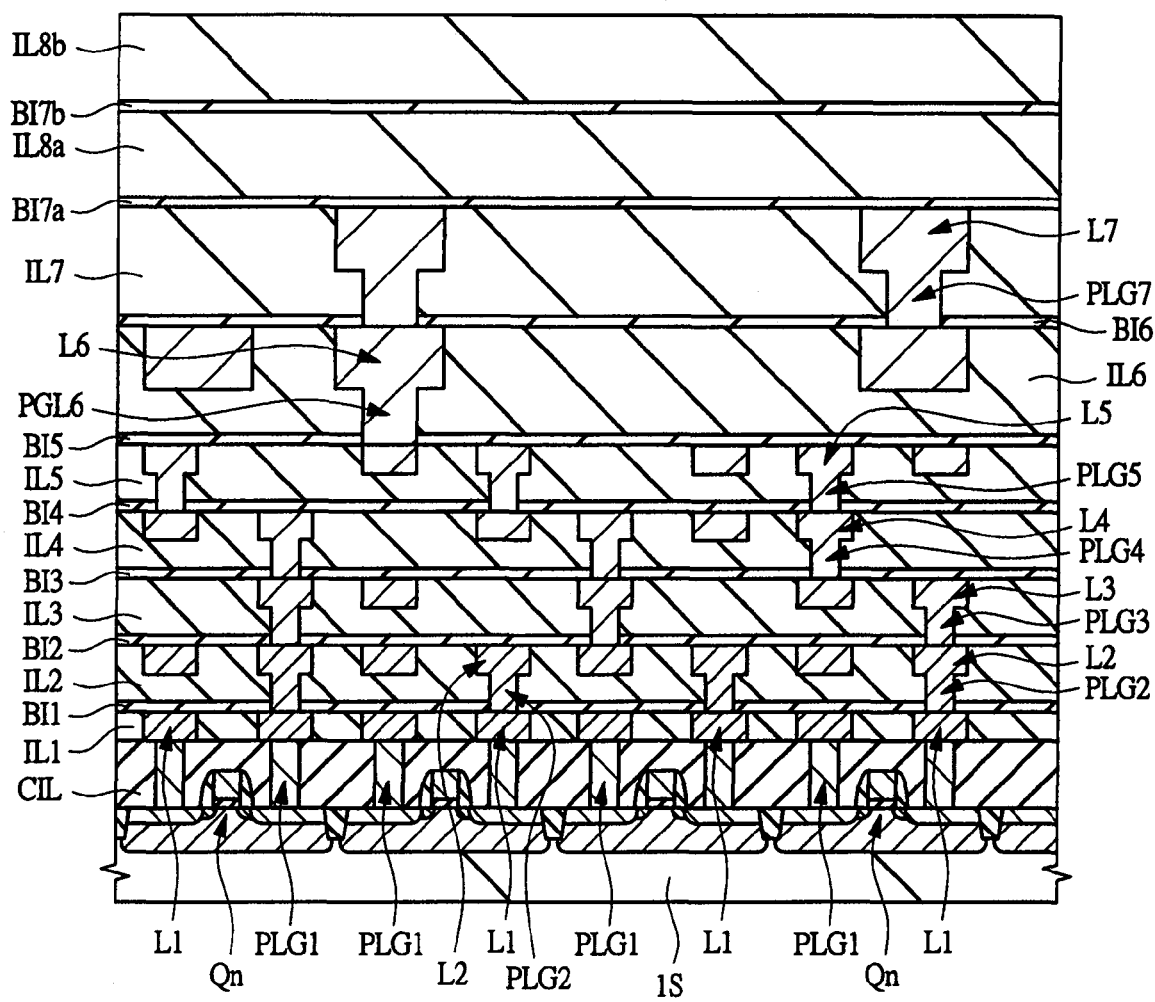
FIG. 33 is a cross-sectional view showing a method for manufacturing the semiconductor device following FIG. 32.

Subsequently, a description will be given to the step of forming the global layer over the semi-global layer. As shown in FIG. 33, on the surface of the interlayer insulation film IL7 including the seventh-layer wirings L7 formed therein, an ammonia plasma treatment is carried out, thereby to clean the surfaces of the seventh-layer wirings L7 and the surface of the interlayer insulation film IL7. Subsequently, over the interlayer insulation film IL7 including the seventh-layer wirings L7 formed therein, a barrier insulation film BI7a is formed. The barrier insulation film BI7a includes, for example, a lamination film of a SiCN film and a SiOC film, and the lamination film can be formed with a CVD method.

Then, over the barrier insulation film BI7a, an interlayer insulation film IL8a is formed. The interlayer insulation film IL8a is formed of, for example, a TEOS film or a silicon oxide film, and can be formed by using, for example, a plasma CVD method. Further, over the interlayer insulation film IL8a, an etching stop insulation film BI7b is formed. Over the etching stop insulation film BI7b, an interlayer insulation film IL8b is formed. The etching stop insulation film BI7b is formed of, for example, a SiCN film. For example, the lamination film can be formed by a CVD method. Further, the interlayer insulation film IL8b is formed of, for example, a TEOS film or a silicon oxide film, and is formed by using, for example, a plasma CVD method.

Figure 34:
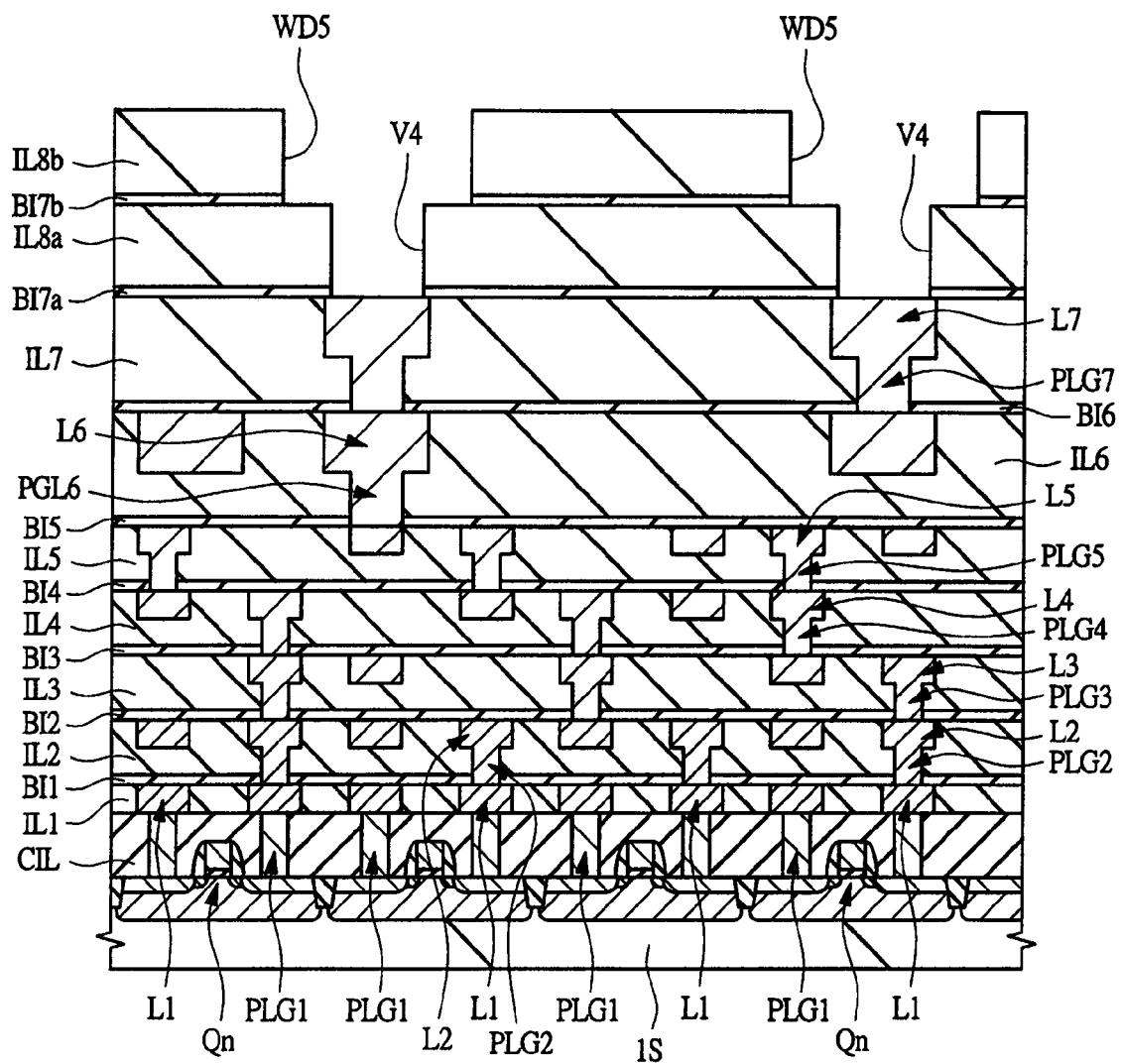
FIG. 34 is a cross-sectional view showing a method for manufacturing the semiconductor device following FIG. 33.

Then, as shown in FIG. 34, by using a photolithography technology and an etching technology, in the interlayer insulation film IL8b and the etching stop insulation film BI7b, wiring grooves WD5 are formed. In addition, in the interlayer insulation film IL8a and the barrier insulation film BI7a, via holes V4 are formed. The via holes V4 are formed in such a manner as to penetrate through the interlayer insulation film IL8a including a TEOS film, a silicon oxide film, or the like, and to reach the seventh-layer wirings L7 at the bottom surfaces thereof. As a result, at the bottoms of the via holes V4, the surfaces of the seventh-layer wirings L7 are exposed.

Figure 35:
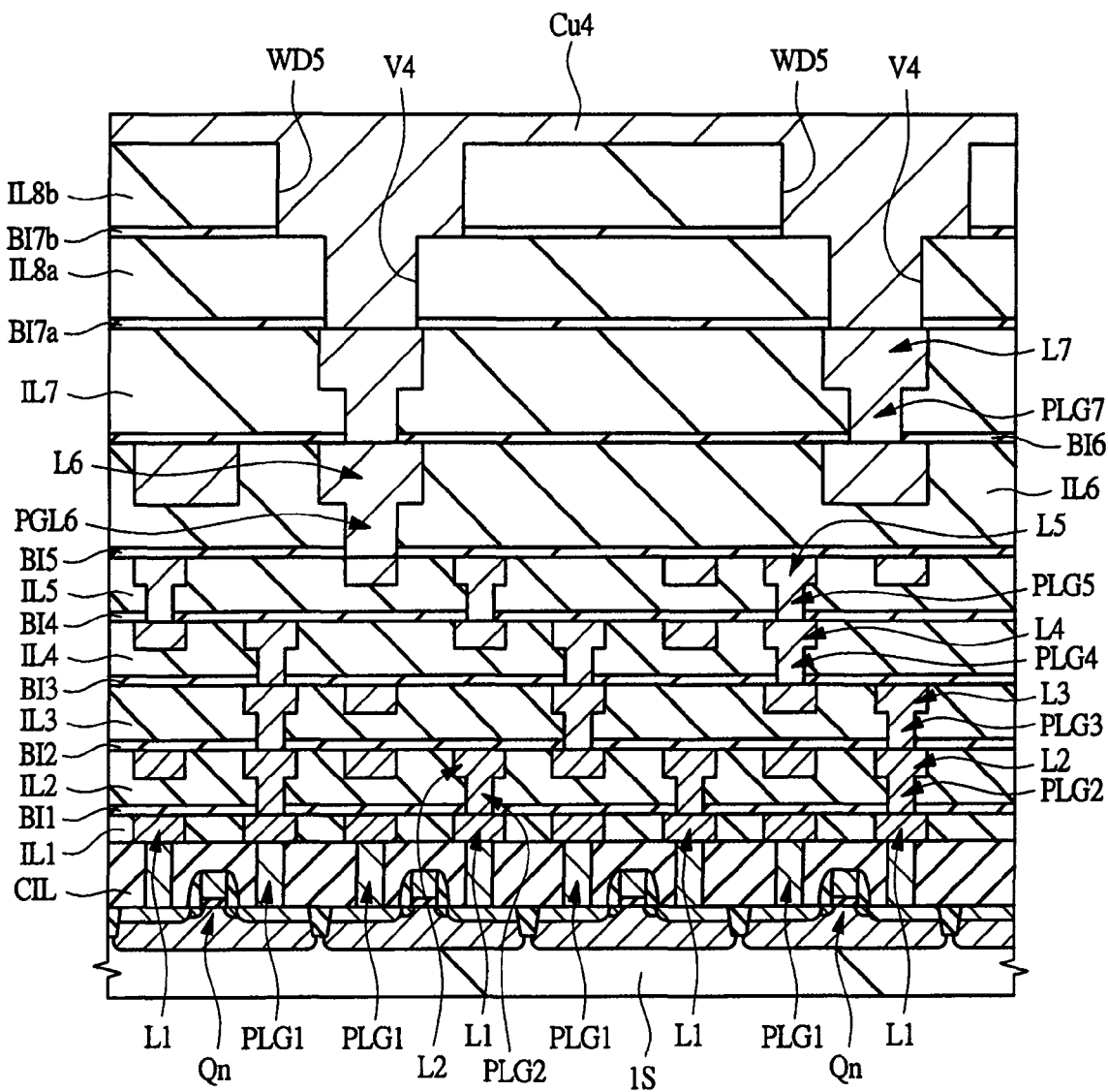
FIG. 35 is a cross-sectional view showing a method for manufacturing the semiconductor device following FIG. 34.

Then, as shown in FIG. 35, over the interlayer insulation film IL8b including the wiring grooves WD5 formed therein, and over the interlayer insulation film IL8a including via holes V4 formed therein, a barrier conductor film (copper diffusion preventive film) (not shown) is formed. Specifically, the barrier conductor film includes tantalum (Ta), titanium (Ti), ruthenium (Ru), tungsten (W), manganese (Mn), and a nitride or a nitride silicide thereof, or a lamination film thereof, and is formed by using, for example, a sputtering method.

Subsequently, over the barrier conductor film formed in the insides of the wiring grooves WD5 and the via holes V4, and over the interlayer insulation film IL8b, a seed film including, for example, a thin copper film is formed by a sputtering method. Then, by an electrolytic plating method using the seed film as an electrode, a copper film Cu4 is formed. The copper film Cu4 is formed in such a manner as fill the wiring grooves WD5 and the via holes V4. The copper film Cu4 is formed of a film mainly including, for example, copper. Specifically, the copper film Cu4 is formed of copper (Cu) or a copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid series metal, or actinoid series metal).

Figure 36:
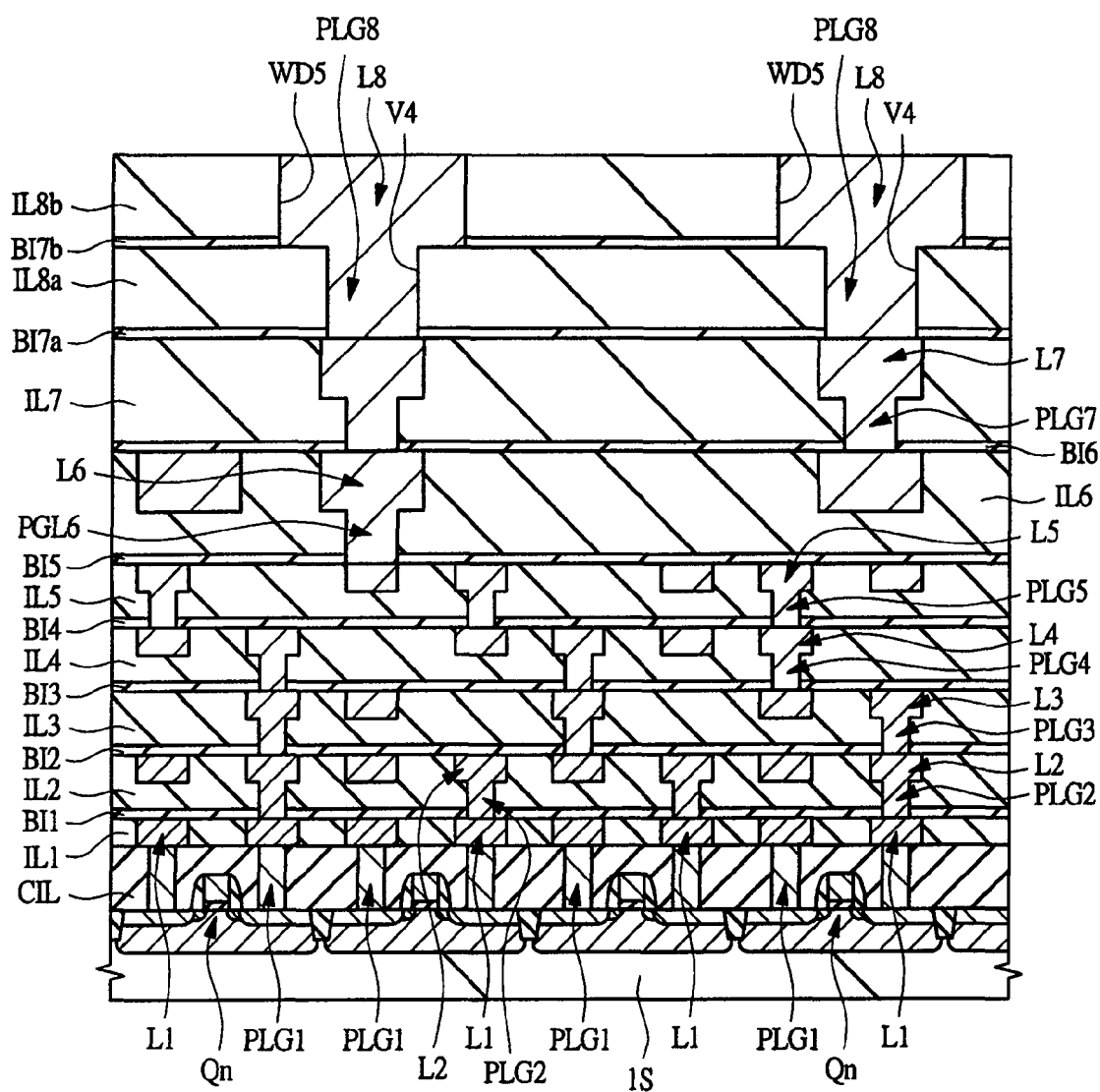
FIG. 36 is a cross-sectional view showing a method for manufacturing the semiconductor device following FIG. 35.

Then, as shown in FIG. 36, unnecessary portions of the barrier conductor film and the copper film Cu4 formed over the interlayer insulation film IL8b are removed by a CMP method. As a result, it is possible to form the eighth-layer wirings L8 in which the barrier conductor film and the copper film Cu4 are embedded in the wiring grooves WD5, and the plugs PLG8 in which the barrier conductor film and the copper film Cu4 are embedded in the via holes V4. In the foregoing manner, the eighth-layer wirings L8 can be formed. As a result, it is possible to form the global layer (eighth-layer wirings L8).

Figure 37:
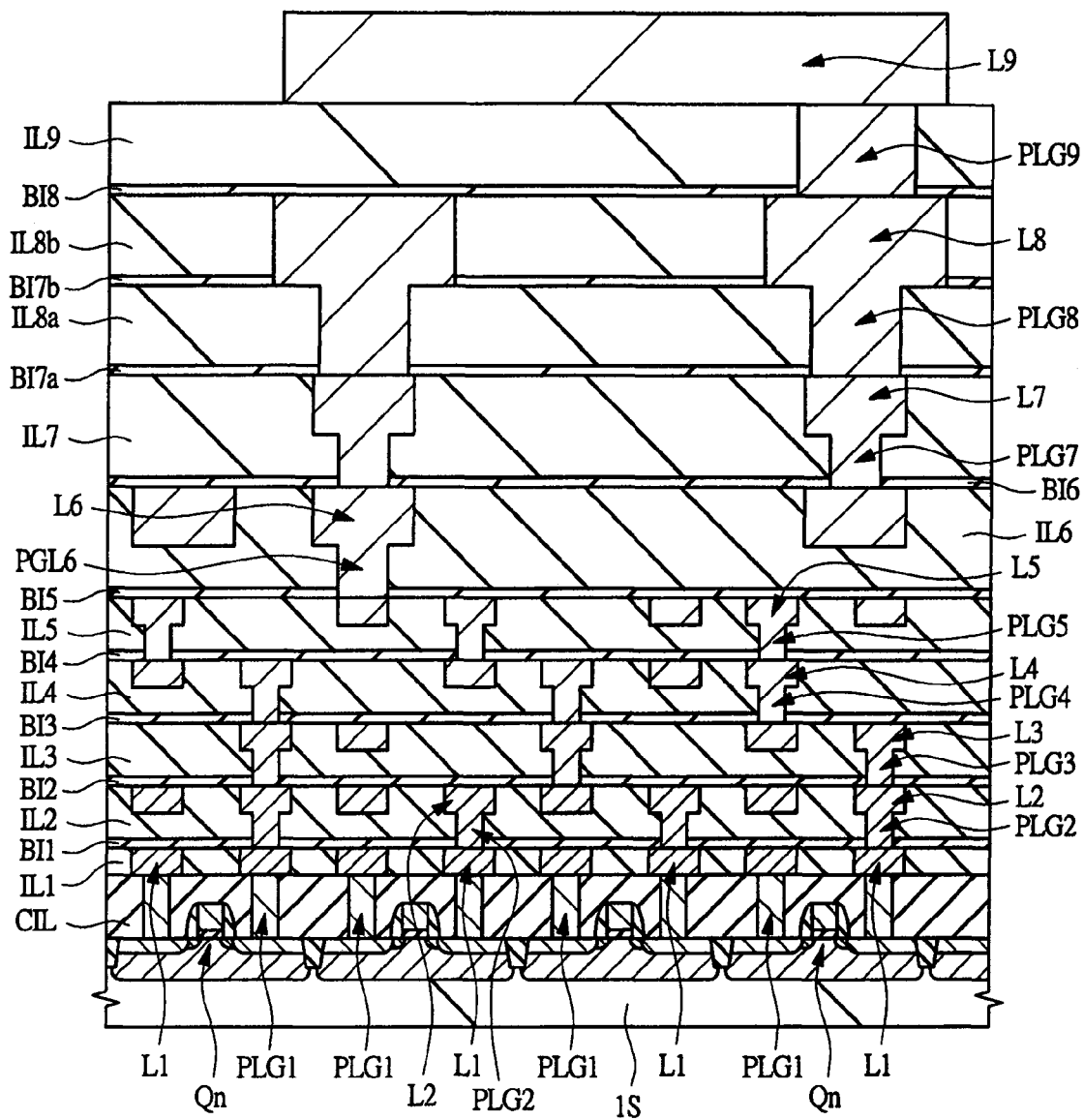
FIG. 37 is a cross-sectional view showing a method for manufacturing the semiconductor device following FIG. 36.

Subsequently, as shown in FIG. 37, over the interlayer insulation film IL8b including the eighth-layer wirings L8 formed therein, a barrier insulation film BI8 is formed. Over the barrier insulation film BI8, an interlayer insulation film IL9 is formed. The barrier insulation film BI8 includes, for example, a lamination film of a SiCN film and a SiOC film. For example, the lamination film can be formed by a CVD method. Further, the interlayer insulation film IL9 is formed of, for example, a TEOS film, a silicon oxide film, or the like, and can be formed by using, for example, a plasma CVD method. Then, there are formed via holes penetrating through the interlayer insulation film IL9 and the barrier insulation film BI8.

Then, in the sidewalls and the bottom surfaces of the via holes, and over the interlayer insulation film IL9, there is formed a lamination film of a titanium/titanium nitride film, an aluminum film, and a titanium/titanium nitride film sequentially stacked. The lamination film is patterned, thereby to form plugs PLG9 and ninth-layer wirings L9 which are the uppermost-layer wirings.

Figure 38:
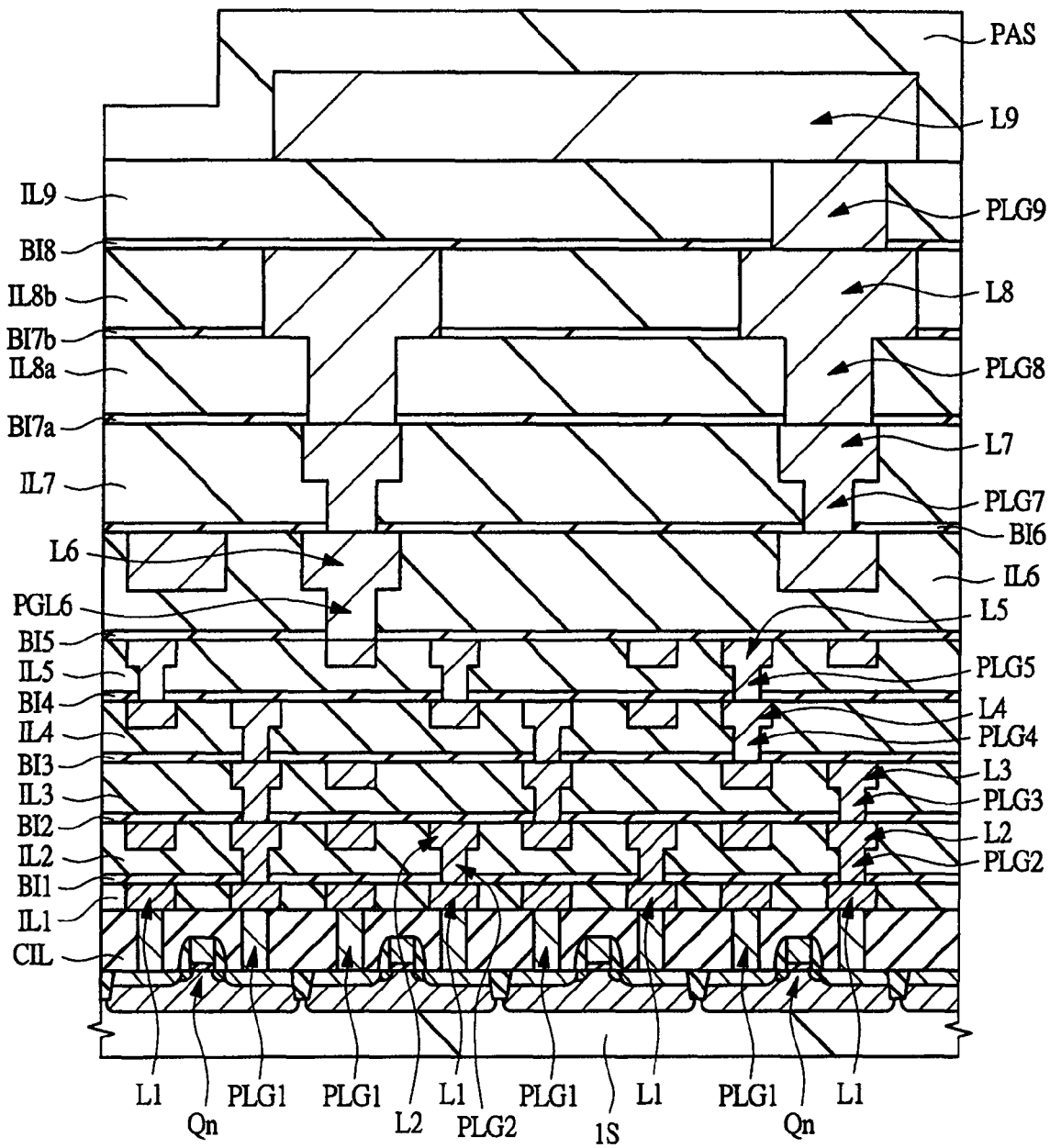
FIG. 38 is a cross-sectional view showing a method for manufacturing the semiconductor device following FIG. 37.
Figure 39:
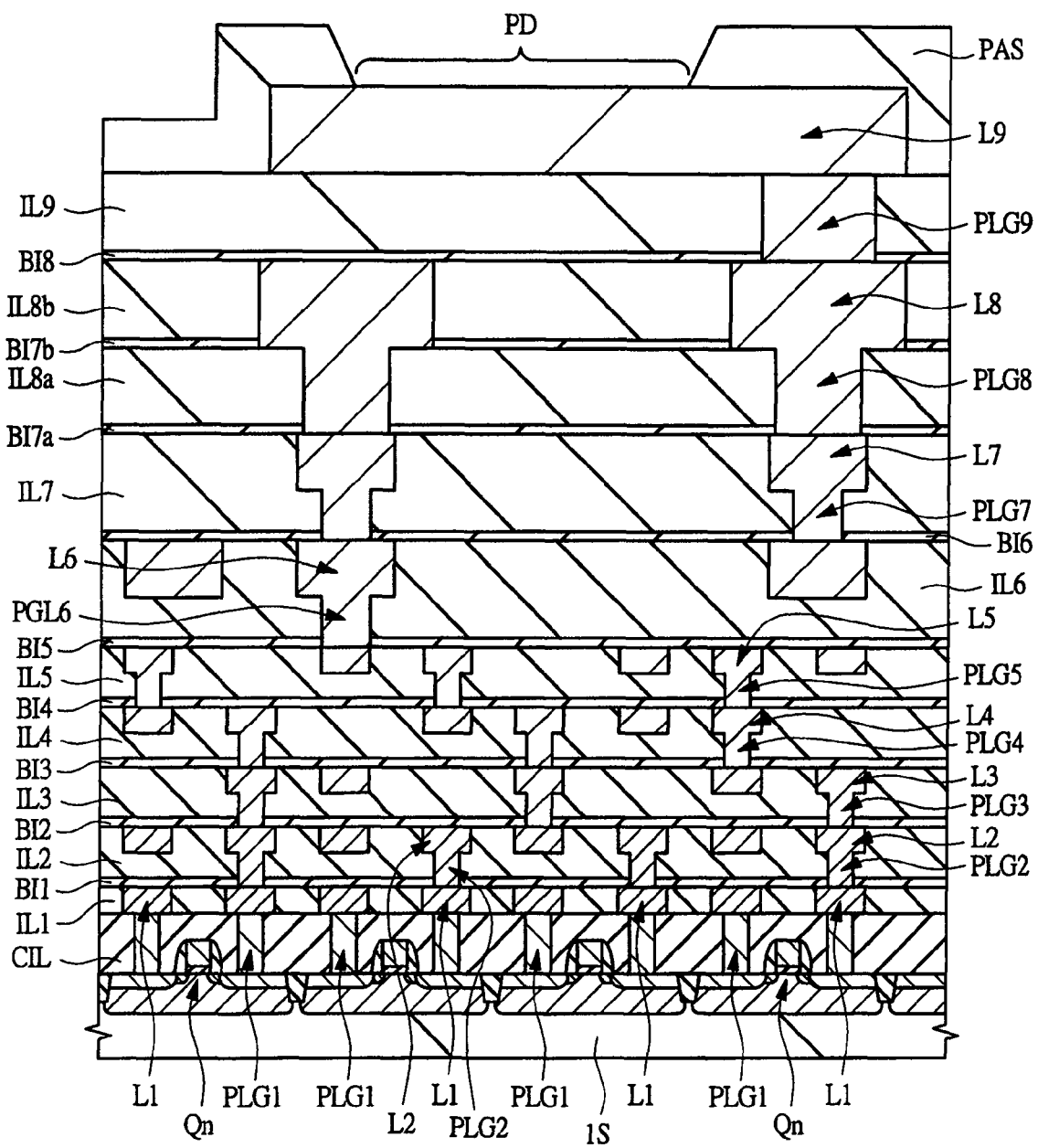
FIG. 39 is a cross-sectional view showing a method for manufacturing the semiconductor device following FIG. 38.

Then, as shown in FIG. 38, over the interlayer insulation film IL9 including the ninth-layer wirings L9 formed therein, there is formed a passivation film PAS serving as a surface protective film. The passivation film PAS is formed of, for example, a silicon oxide film, and a silicon nitride film disposed over the silicon oxide film, and can be formed with, for example, a CVD method. Then, as shown in FIG. 39, by using a photolithography technology and an etching technology, in the passivation film PAS, an opening is formed to expose a part of the ninth-layer wiring L9, resulting in the formation of a pad PD.

Figure 40:
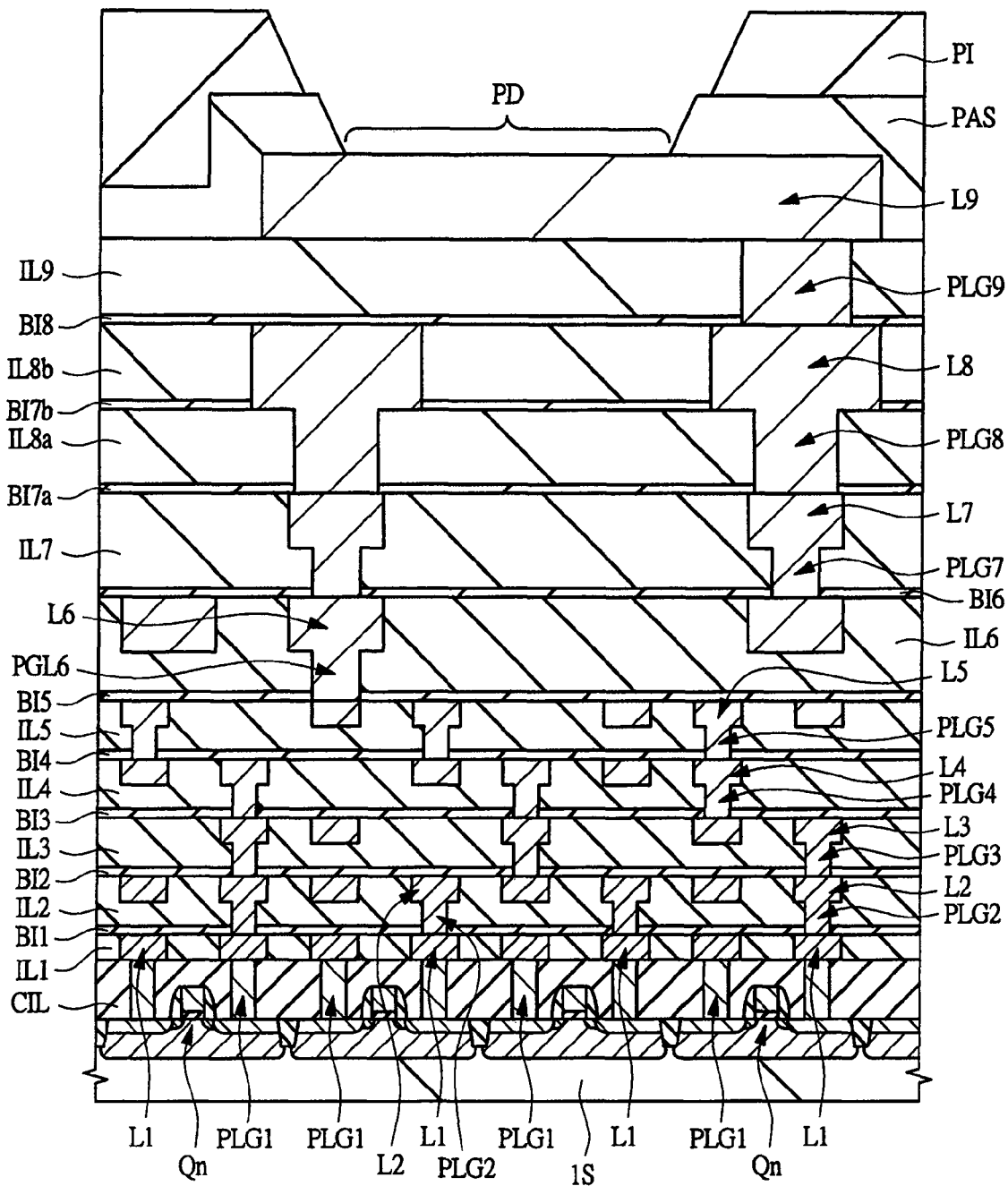
FIG. 40 is a cross-sectional view showing a method for manufacturing the semiconductor device following FIG. 39.

Then, as shown in FIG. 40, over the passivation film PAS at which the pad PD is exposed, a polyimide film PI is formed. Then, the polyimide film PI is patterned, thereby to expose the pad PD. In the foregoing manner, over the semiconductor substrate 1S, MISFITs and multilayer wirings are formed. As a result, the semiconductor device of the present embodiment shown in FIG. 1 is completed.

Incidentally, the porous Low-k film described in the present embodiment has no particular restriction so long as the pores 10 shown in FIG. 3 are formed in the porous Low-k film due to porogen elimination. Other than SiOC, as the materials, for example, a MSQ film or a HSQ film having the pores 10 may be used. As the method for manufacturing the porous Low-k film, the following procedure may be adopted: by a coating method, an insulation film having a plurality of pores containing a porogen gas therein is formed; then, the curing step of eliminating (exhausting) porogen from the inside of the insulation film is performed to form the porous Low-k film.

Further, when the porous Low-k film is formed by a CVD method, $O_2$ (oxygen), He (helium), $C_5H_{14}O_2Si$ (methyldiethoxysilane) and porogen which are raw-material gases are supplied, thereby to deposit the interlayer insulation film IL2 shown in FIG. 1. However, it is experimentally confirmed that the porous Low-k film of the present invention can be formed even when the flow rate of porogen is set at 24 to 53% of the total flow rate of the raw-material gases. Even when a wafer with a diameter of 300 mm is used, the conditions are effective.

Up to this point, the invention made by the present inventors was specifically described by way of embodiments. However, it is naturally understood that the present invention is not limited to the foregoing embodiments, and may be variously changed within the scope not departing from the gist thereof.

For example, in the embodiments, a description was given to the semiconductor device in which the interlayer insulation films IL2 to IL5 in the second fine layer shown in FIG. 1 each include a porous Low-k film having a plurality of pores with a mean diameter of 1.0 nm or more and less than 1.45 nm in the inside thereof. However, it is also acceptable that for the interlayer insulation film IL1 in the first fine layer, or the interlayer insulation films IL6 and IL7 in the semi-global layer, the same porous Low-k films as the interlayer insulation films IL2 to IL5 are used. This is due to the following fact: conceivably, with miniaturization of a semiconductor device, there arises a necessity of further enhancing the reliability of the interlayer insulation film also in the first fine layer or the semi-global layer.

The present invention is widely used for a semiconductor device having a porous Low-k film.

What is claimed is:
1. A semiconductor device, comprising:
   a semiconductor substrate;
   an interlayer insulation film formed over the semiconductor substrate, and having a plurality of pores in the inside thereof; and
   a wiring formed in contact with the interlayer insulation film,
   wherein the plurality of pores comprise a plurality of first pores formed in the interlayer insulation film by the formation of an insulation film, and a plurality of second pores formed at positions from each of which porogen disposed in the insulation film has been eliminated due to the formation of the interlayer insulation film by subjecting the insulation film to a curing step, and wherein a mean diameter of the plurality of pores is 1.0 nm or more and less than 1.45 nm.

2. The semiconductor device according to claim 1, wherein the mean diameter of the second pores is larger than the mean diameter of the first pores.

3. The semiconductor device according to claim 1, wherein the mean diameter of the pores is 1.29 nm or more.

4. The semiconductor device according to claim 1, wherein the mean diameter of the second pores is less than 1.7 nm.

5. The semiconductor device according to claim 1, wherein the wiring is a damascene wiring embedded in a wiring groove formed in the top surface of the interlayer insulation film, and wherein at the interface between the wiring and the interlayer insulation film, a barrier conductor film is formed.

6. The semiconductor device according to claim 1, wherein the wiring comprises a metal film mainly comprising Cu.

7. The semiconductor device according to claim 5, wherein over the interlayer insulation film, and over the wiring, a barrier insulation film is formed, and wherein the respective top surfaces of the interlayer insulation film and the wiring are in contact with the barrier insulation film.

8. The semiconductor device according to claim 1, wherein the second pores have a mean diameter of 1.0 nm or more.

9. A semiconductor device, comprising:

a semiconductor substrate;

a semiconductor element disposed over the semiconductor substrate;

a contact interlayer insulation film covering the semiconductor element and disposed over the semiconductor substrate;

a first plug penetrating through the contact interlayer insulation film, and electrically coupled with the semiconductor element;

a first interlayer insulation film disposed over the contact interlayer insulation film including the first plug disposed therein;

a first wiring disposed in the first interlayer insulation film, and electrically coupled with the first plug;

a second interlayer insulation film disposed over the first interlayer insulation film including the first wiring disposed therein, and having a plurality of pores in the inside thereof;

a second plug disposed in the second interlayer insulation film, and electrically coupled with the first wiring;

a second wiring disposed in the second interlayer insulation film, and electrically coupled with the second plug;

a third interlayer insulation film disposed over the second interlayer insulation film including the second wiring disposed therein;

a third plug disposed in the third interlayer insulation film, and electrically coupled with the second wiring; and a third wiring disposed in the third interlayer insulation film, and electrically coupled with the third plug, wherein the plurality of pores comprise a plurality of first pores formed in the insulation film by the formation of an insulation film, and a plurality of second pores formed at positions from each of which porogen disposed in the insulation film has been eliminated due to the formation of the second interlayer insulation film by subjecting the insulation film to a curing step, and wherein a mean diameter of the plurality of pores is 1.0 nm or more and less than 1.45 nm.

10. The semiconductor device according to claim 9, wherein the mean diameter of the second pores is larger than the mean diameter of the first pores, and wherein in the third interlayer insulation film, a plurality of third pores with a smaller mean diameter than that of the second pores are formed.

11. The semiconductor device according to claim 9, wherein in the third interlayer insulation film, the first pores are formed, and the second pores are not formed.

12. The semiconductor device according to claim 9, wherein the mean diameter of the pores is 1.29 nm or more.

13. The semiconductor device according to claim 10, wherein the mean diameter of the second pores is less than 1.7 nm.

14. The semiconductor device according to claim 9, wherein the second wiring is a damascene wiring embedded in a wiring groove formed in the top surface of the second interlayer insulation film, and wherein at the interface between the second wiring and the interlayer insulation film, a barrier conductor film is formed.

15. The semiconductor device according to claim 9, wherein the second wiring comprises a metal film mainly comprising Cu.

16. The semiconductor device according to claim 14, wherein over the second interlayer insulation film, and over the second wiring, a barrier insulation film is formed, and wherein the respective top surfaces of the second interlayer insulation film and the second wiring are in contact with the barrier insulation film.

17. The semiconductor device according to claim 9, wherein the second pores have a mean diameter of 1.0 nm or more.

* * * * *